United States Patent
Seo et al.

(10) Patent No.: US 11,231,778 B2
(45) Date of Patent: Jan. 25, 2022

(54) BIDIRECTIONAL SELF-HEALING NEURAL INTERFACE

(71) Applicant: KOREA INSTITUTE OF SCIENCE AND TECHNOLOGY, Seoul (KR)

(72) Inventors: Hyunseon Seo, Seoul (KR); Inchan Youn, Seoul (KR); Hyojin Lee, Seoul (KR); Kang-Il Song, Seoul (KR); Donghee Son, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 16/902,040

(22) Filed: Jun. 15, 2020

(65) Prior Publication Data
US 2020/0401223 A1   Dec. 24, 2020

Related U.S. Application Data

(60) Provisional application No. 62/863,779, filed on Jun. 19, 2019.

(30) Foreign Application Priority Data

Jun. 25, 2019  (KR) .................... 10-2019-0075580
Jun. 25, 2019  (KR) .................... 10-2019-0075581

(Continued)

(51) Int. Cl.
*H05K 1/18*   (2006.01)
*G06F 3/01*   (2006.01)
(Continued)

(52) U.S. Cl.
CPC ............ *G06F 3/015* (2013.01); *C08G 77/388* (2013.01); *C08K 3/08* (2013.01); *H05K 1/028* (2013.01);
(Continued)

(58) Field of Classification Search
CPC ......... G06F 3/015; C08G 77/388; C08K 3/08; C08K 2003/0806; H05K 1/028;
(Continued)

(56) References Cited

U.S. PATENT DOCUMENTS

| | | | |
|---|---|---|---|
| 2016/0049217 A1* | 2/2016 | Tee ..................... | H01M 4/622 429/217 |
| 2019/0237228 A1* | 8/2019 | Wang ................... | H01F 1/0572 |

* cited by examiner

*Primary Examiner* — Binh B Tran
(74) *Attorney, Agent, or Firm* — Rabin & Berdo, P.C.

(57) ABSTRACT

A bidirectional self-healing neural interface includes a first elastic substrate; a neural electrode disposed on the first elastic substrate and comprising a conductive polymer composite; and a second elastic substrate disposed on the neural electrode. The conductive polymer composite includes a matrix formed of a self-healing polymer material; and a plurality of electrical conductor clusters distributed in the matrix. Each of the electrical conductor clusters includes particles of a first electrical conductor; and a plurality of particles of a second electrical conductor formed of the same material as that of the first electrical conductor, distributed around each of the particles of the first electrical conductor, and having sizes that are smaller than those of the particles of the first electrical conductor. The first electrical conductor is a source for generating the second electrical conductor. The neural interface has excellent elasticity, electrical conductivity that is improved by deformation, and is self-healing.

19 Claims, 33 Drawing Sheets

(30) Foreign Application Priority Data

Dec. 5, 2019 (KR) .......................... 10-2019-0161037
Dec. 5, 2019 (KR) .......................... 10-2019-0161038

(51) Int. Cl.
*C08K 3/08* (2006.01)
*C08G 77/388* (2006.01)
*H05K 1/02* (2006.01)
*H05K 1/09* (2006.01)
*H05K 3/14* (2006.01)
*H05K 3/28* (2006.01)
*H05K 1/11* (2006.01)

(52) U.S. Cl.
CPC ............... *H05K 1/09* (2013.01); *H05K 1/118* (2013.01); *H05K 3/14* (2013.01); *H05K 3/28* (2013.01); *C08K 2003/0806* (2013.01); *H05K 2201/0317* (2013.01); *H05K 2201/0329* (2013.01)

(58) Field of Classification Search
CPC . H05K 1/09; H05K 1/118; H05K 3/14; H05K 3/28; H05K 2201/0317; H05K 2201/0329
See application file for complete search history.

6 weeks biopsy H&E staining

After 6 week implantation

SNR color map of neural recording from strong mechanical stimulation

SNR color map of neural recording from weak mechanical stimulation

BIDIRECTIONAL SELF-HEALING NEURAL INTERFACE

CROSS-REFERENCE TO RELATED APPLICATIONS

This application claims the benefit of U.S. Provisional Patent Application No. 62/863,779 filed on Jun. 19, 2019, in the US Patent and Trademark Office, Korean Patent Application No. 10-2019-0075580, filed on Jun. 25, 2019, Korean Patent Application No. 10-2019-0075581, filed on Jun. 25, 2019, Korean Patent Application No. 10-2019-0161037 filed on Dec. 5, 2019, and Korean Patent Application No. 10-2019-0161038 filed on Dec. 5, 2019, respectively, in the Korean Intellectual Property Office, the disclosures of which are incorporated herein by reference in their entirety.

BACKGROUND

1. Field

The present invention relates to a bidirectional neural interface having excellent elasticity and electrical conductivity improved by deformation, and further having self-healability and a method of manufacturing the same.

2. Description of the Related Art

In recent years, human body-friendly and highly elastic polymer materials have been used in wearable electronic devices that are applied to biomedical devices, robots, and flexible devices. Such highly elastic polymer materials may be used to stably transmit power and data between an electronic device and a human body and may be applied to mechanically elastic interconnectors. That ability of the interconnectors to transmit power and data should not deteriorate even when they are considerably deformed, e.g., rapidly stretched. Although a part of an interconnector is further damaged or even cut, the value of utilization thereof may be increased in the case where the interconnector is restored by self-healability.

However, it is very difficult to realize all of high elasticity, high conductivity, and excellent self-healability. Current wearable human-robot interfaces cannot support long-term interactions between a human body and a machine due to the lack of self-healing and elastic interconnectors that enable feedback communication even after considerable damage. In order to improve self-healability of an elastic electrical conductor, a technique of healing cracks by using a micro capsule consisting of a monomer and a catalyst and included therein is known in the art. However, this technique allows only one healing for a crack located near the micro capsule. As another method, a technique of applying ultraviolet (UV) rays or heat to a portion where a crack occurs from the outside is known in the art. Recently, a method of forming an eutectic Ga—In (EGaIn) liquid-phase metal alloy layer on a polymer substrate having self-healability has also been suggested. Although this structure exhibits high elasticity and excellent self-healability, it is difficult to apply a liquid-phase metal to electronic devices.

SUMMARY

The present invention has been proposed to solve various problems including the above problems, and an object of the present invention is to provide a bidirectional self-healing neural interface having excellent elasticity and electrical conductivity, which does not deteriorate even by considerably deformation and a method of manufacturing the same. However, these problems to be solved are illustrative and the scope of the present invention is not limited thereby.

Additional aspects will be set forth in part in the description which follows and, in part, will be apparent from the description, or may be learned by practice of the presented embodiments.

According to an aspect of the present invention to achieve the object, provided is a bidirectional self-healing neural interface including a first elastic substrate, a neural electrode disposed on the first elastic substrate and including a conductive polymer composite, and a second elastic substrate disposed on the neural electrode.

According to an embodiment of the present invention, the conductive polymer composite may include a matrix formed of a self-healing polymer material, and a plurality of electrical conductor clusters distributed in the matrix, wherein each of the electrical conductor clusters includes particles of a first electrical conductor, and a plurality of particles of a second electrical conductor formed of the same material as that of the first electrical conductor, distributed around each of the particles of the first electrical conductor, and having smaller sizes than sizes of the particles of the first electrical conductor.

According to an embodiment of the present invention, the elastic substrates may include a self-healing polymer material.

According to an embodiment of the present invention, the elastic substrates and the neural electrode may be connected by self-bonding and disposed near a nerve.

According to an embodiment of the present invention, the conductive polymer composite may be formed as a thin-film form, and a gold (Au) nanomembrane may be transfer-printed on one surface of the thin-film.

According to an embodiment of the present invention, the bidirectional self-healing neural interface may further include a metal pad disposed on the first elastic substrate, wherein the first elastic substrate is bonded to the neural electrode via holes formed in the metal pad.

According to an embodiment of the present invention, the metal pad may be formed to be additionally connected to an external neural signal recoding amplifier.

According to an embodiment of the present invention, a substrate support layer may be formed on one surface of the first elastic substrate, and the substrate support layer may have a plurality of separated regions arranged at predetermined intervals.

According to an embodiment of the present invention, an electrical conductivity of the neural electrode may increase when a deformed state by an external force is maintained for a certain period of time.

According to an embodiment of the present invention, a rearrangement process to connect the electrical conductor clusters, which have been spaced apart from each other because of deformation caused by an external force, may be performed in the neural electrode.

According to an embodiment of the present invention, the neural electrode may be rearranged such that the electrical conductor clusters spaced apart from each other because of deformation caused by an external force are connected to each other when the deformation is maintained for a certain period of time.

According to an embodiment of the present invention, stress may be relaxed when deformation caused by an external force is maintained for a certain period of time.

According to an embodiment of the present invention, a source for generating the second electrical conductor may be the first electrical conductor.

According to an embodiment of the present invention, the self-healing polymer material may include an elastomer material including one of polydimethylsiloxane (PDMS), polyethyleneoxide (PEO), perfluoropolyether (PFPE), polybutylene (PB), poly(ethylene-co-1-butylene), poly(butadiene), hydrogenated poly(butadiene), a poly(ethylene oxide)-poly(propylene oxide) block copolymer or random copolymer, and poly(hydroxyalkanoate), as a backbone.

According to an embodiment of the present invention, the self-healing polymer material may include PDMS-4,4'-methylenebis(phenyl urea) (MPU) 0.4-isophorone bisurea units (IU) 0.6.

According to an embodiment of the present invention, the first electrical conductor may be a metal material.

According to an embodiment of the present invention, the metal material may include at least one of Ag, Au, Cu, Al, W, Mo, Ti, Cr, Ni, and Pt.

According to an embodiment of the present invention, the neural electrode may have a strain of 3500% or less.

According to an embodiment of the present invention, the first electrical conductor may have at least one of a plate-like shape, a spherical shape, a polyhedral shape, a fibrous shape, and an irregular shape.

According to an embodiment of the present invention, the first electrical conductor may have a size of 500 nm to 2 μm.

According to an embodiment of the present invention, the second electrical conductor may have a size of 50 nm or less.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
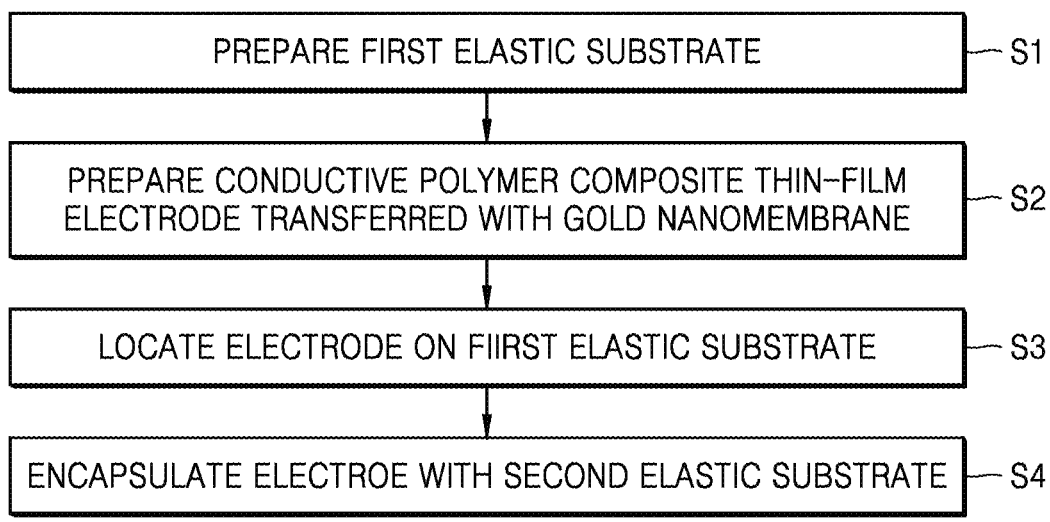
FIG. 1 is a flowchart illustrating a method of manufacturing a bidirectional self-healing neural interface according to an embodiment of the present invention.

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, thicknesses or sizes of layers and regions are exaggerated for clarity.

According to an embodiment of the present invention, a neural electronic interface without compressive stress due to dynamic stress relaxation and insensitive to deformation is provided. The neural interface according to an embodiment of the present invention may minimize immune responses and device failure caused by pressed nerves by significantly reducing mechanical mismatch in biological and non-biological interfaces.

A bidirectional self-healing neural interface according to an embodiment of the present invention includes a first elastic substrate, a neural electrode disposed on the first elastic substrate and including a conductive polymer composite, and a second elastic substrate disposed on the neural electrode.

According to an embodiment of the present invention, the conductive polymer composite has a structure in which electrical conductor particles are distributed in a matrix formed of a self-healing polymer material. An elastic polymer may be an example of the self-healing polymer material.

According to an embodiment of the present invention, the elastic substrate may include a self-healing polymer material. According to an embodiment of the present invention, a substrate support layer may be formed on one surface of the first elastic substrate. For example, the first elastic substrate may be prepared by forming the substrate support layer on a substrate having self-healability. Alternatively, a third elastic substrate having self-healability may further be disposed on the first elastic substrate provided with the substrate support layer.

The self-healing polymer material refers to a polymer having the ability to self-heal a damage that occurs in an internal structure and recover to a state before the damage occurred. Examples of the polymer material may include elastomer materials including one of polydimethylsiloxane (PDMS), polyethyleneoxide (PEO), perfluoropolyether (PFPE), polybutylene (PB), poly(ethylene-co-1-butylene), poly(butadiene), hydrogenated poly(butadiene), a poly(ethylene oxide)-poly(propylene oxide) block copolymer or random copolymer, and poly(hydroxyalkanoate), as a backbone. The self-healing polymer material may be manufactured by adding a precursor or a new unit to the elastomer including the above-described material as a backbone. For example, PDMS-4,4'-methylenebis(phenyl urea) (MPU) 0.4-isophorone bisurea units (IU) 0.6 that is a material including PDMS as a backbone may be used the self-healing polymer material.

The electrical conductor particles distributed in the conductive polymer composite impart electrical conductivity to the composite allowing the thin film to function as an electrode. In addition, when the composite is deformed by an external force, the conductive filler materials serve as a factor causing internal dynamic rearrangement to change electrical conductivity of the composite.

The electrical conductor particles may include particles of a metal material. The metal material may include a metal with high electrical conductivity such as Ag, Cu, Au, and Al. In addition, at least one of W, Mo, Ti, Cr, Ni, and Pt may be included therein. The particles of the metal material may have a spherical shape, a flake shape, a plate-like shape, a fibrous shape, a wire shape, or the like, and may also have an irregular shape which is not specifically defined.

In the conductive polymer composite according to an embodiment of the present invention, the electrical conductor particles distributed therein may be in the form of clusters in which particles of the same material having different sizes are disposed to be adjacent to each other. For descriptive convenience, particles having relatively large sizes are referred to as first electrical conductor particles, and particles having relatively small sizes are referred to as second electrical conductor particles. For example, the first electrical conductor particles may have a size of 500 nm to 2 μm, and the second electrical conductor particles may have a size of 50 nm or less (greater than 0). Each of the electrical conductor particles may include a first electrical conductor particle and a plurality of second electrical conductor particles formed of the same material as the first electrical conductor particle, distributed around the first electrical conductor particle, and having smaller sizes than that of the first electrical conductor particle.

The second electrical conductor particles may be produced using the introduced first electrical conductor particles as a source. For example, when the first electrical conductor particles are metal particles, the second electrical conductor particles having nanometer sizes may be formed while metal ions, which are diffusing from an oxide layer formed on the surface of each metal particle into the matrix, are combined with electrons supplied by the matrix. Thus, the second metal particles are distributed around each of the first metal particles used as the source.

When an external force is applied to the conductive polymer composite neural electrode having such a microstructure according to an embodiment of the present invention, plastic deformation in which a chain structure of the polymer material constituting the matrix is rearranged occurs. During the plastic deformation of the matrix, rearrangement of the electrical conductor clusters distributed therein also occurs, and electrical conductivity also significantly changes due to the electrical conductor clusters.

For example, electrical conductivity of the conductive polymer composite neural electrode according to an embodiment of the present invention may increase during a process in which the length is extended by the external force. As another example, when an external force is applied to cause deformation to extend the length of the composite neural electrode and the deformation is maintained for a certain period of time, electrical conductivity may significantly increase when compared with that in the early stage of deformation.

The bidirectional neural interface according to an embodiment of the present invention in which the conductive polymer composite neural electrode is connected to the polymer substrate having self-healability by self-bonding may be disposed near a nerve. The bidirectional neural interface manufactured as described above may have performance less sensitive to deformation without compressive stress by efficiently releasing strain energy.

The conductive polymer composite neural electrode may be prepared, for example, by drying a mixed solution obtained by adding the electrical conductor particles to a solution of the polymer constituting the matrix, and the first electrical conductor particles may be a raw material added to prepare the mixed solution. In addition, the second electrical conductor particles may be produced from the first electrical conductor particles as a source. For example, when the first electrical conductor particles are metal particles, the second electrical conductor particles having nanometer sizes may be formed in a process while metal ions, which are diffusing from an oxide layer formed on the surface of each metal particle into the matrix, are combined with electrons supplied by the matrix. Thus, the second metal particles are distributed around each of the first metal particles used as the source.

According to an embodiment of the present invention, the conductive polymer composite neural electrode may be formed as a thin-film and a gold (Au) nanomembrane may be transfer-printed on one surface of the thin-film. The neural electrode, which includes the conductive polymer composite thin-film to which the Au nanomembrane is transferred and is in contact with an upper surface of the first elastic substrate, may collect bio signals and transmit the collected bio signals. The electrode may be encapsulated by stacking the second elastic substrate on the electrode for protection.

A method of manufacturing a bidirectional self-healing neural interface according to an embodiment of the present invention includes (S1) preparing a first elastic substrate, (S2) preparing an electrode including a thin-film of a conductive polymer composite to which an Au nanomembrane is transferred, (S3) locating the electrode on the first elastic substrate, and (S4) encapsulating the electrode with a second elastic substrate.

In the bidirectional neural interface manufactured according to the above-described method, the elastic substrates and the electrode may be assembled by self-bonding without an additional sealing process.

The process of preparing the electrode (S2) may include (S21) depositing the Au nanomembrane on a substrate, (S22) preparing a mixed solution of a self-healing polymer material and electrical conductor particles, (S23) coating the mixed solution on the substrate deposited with the Au nanomembrane, (S24) evaporating a solvent from the mixed solution to form a thin-film of a conductive polymer composite on which the Au nanomembrane is transfer-printed, and (S25) detaching the thin-film from the substrate. The substrate may include a silicon oxide layer. Due to a weak interaction between the silicon oxide and the Au nanomembrane deposited thereon, the Au nanomembrane may be easily detached from the substrate. The depositing of the Au nanomembrane on the substrate may be performed by evaporation or sputtering. By coating a mixed solution of the polymer material and the electrical conductor particles on the substrate and drying the coated solution, a thin film formed of the conductive polymer composite may be formed. The conductive polymer composite may have a structure in which the electrical conductor particles are distributed in a matrix formed of the self-healing polymer material. The conductive polymer composite thin-film on which the Au nanomembrane is transfer-printed may be separated from the substrate. This is because of attraction between the Au nanomembrane and the conductive polymer composite.

According to an embodiment of the present invention, the first elastic substrate may be self-bonded to the neural electrode by locating a metal pad on the first elastic substrate and locating the electrode on the metal pad. The metal pad may further be connected to an external neural signal recoding amplifier.

According to an embodiment of the present invention, the substrate support layer may be formed on one surface of the first elastic substrate, and the substrate support layer may have a plurality of separated regions aligned at predetermined intervals.

When an external force is applied to the conductive polymer composite neural electrode having according to an embodiment of the present invention, plastic deformation in which a chain structure of the polymer constituting the matrix is rearranged occurs. During the plastic deformation of the matrix, rearrangement of the electrical conductor clusters distributed therein also occurs, and electrical conductivity also significantly changes by the electrical conductor clusters.

For example, electrical conductivity of the composite neural electrode according to an embodiment of the present invention may increase during a process in which the length is extended by the external force. As another example, when an external force is applied to cause deformation to extend the length of the composite neural electrode and the deformation is maintained for a certain period of time, electrical conductivity may significantly increase when compared with that in the early stage of deformation. According to an embodiment of the present invention, in the neural electrode, a rearrangement process to connect the electrical conductor clusters, which have been spaced apart from each other because of deformation by the external force, may be performed. According to an embodiment of the present invention, the neural electrode may be rearranged such that the electrical conductor clusters, which are spaced apart from each other by deformation caused by an external force, are rearranged to be connected to each other when the deformation is maintained for a certain period of times. According to an embodiment of the present invention, stress may be relaxed since the deformation by the external force is maintained for a certain period of time. According to an embodiment of the present invention, the neural electrode may have a strain of 3500% or less.

Hereinafter, the present invention will be described in detail with reference to the following example and experimental examples. However, these examples and experimental Examples are not intended to limit the purpose and scope of the present invention.

In the experimental examples, PDMS-4,4'-methylenebis (phenyl urea) (MPU) 0.4-isophorone bisurea units (IU) 0.6 was selected as a self-healing polymer constituting the elastic substrate and the matrix, and Ag particles in the form of flakes were selected as electrical conductor particles.

EXAMPLE 1.5 g of PDMS-4,4'-methylenebis(phenyl urea) (MPU) 0.4-isophorone bisurea units (IU) 0.6 (hereinafter, referred to as 'self-healing polymer (SHP)') was mixed with 8 mL of chloroform to prepare a solution, and the solution was stirred for 1 hour. Ag particles (hereinafter, referred to as 'Ag flakes') were added to the solution, and the mixture was stirred for 30 minutes to prepare an Ag flake-SHP mixed solution.

Figure 2:
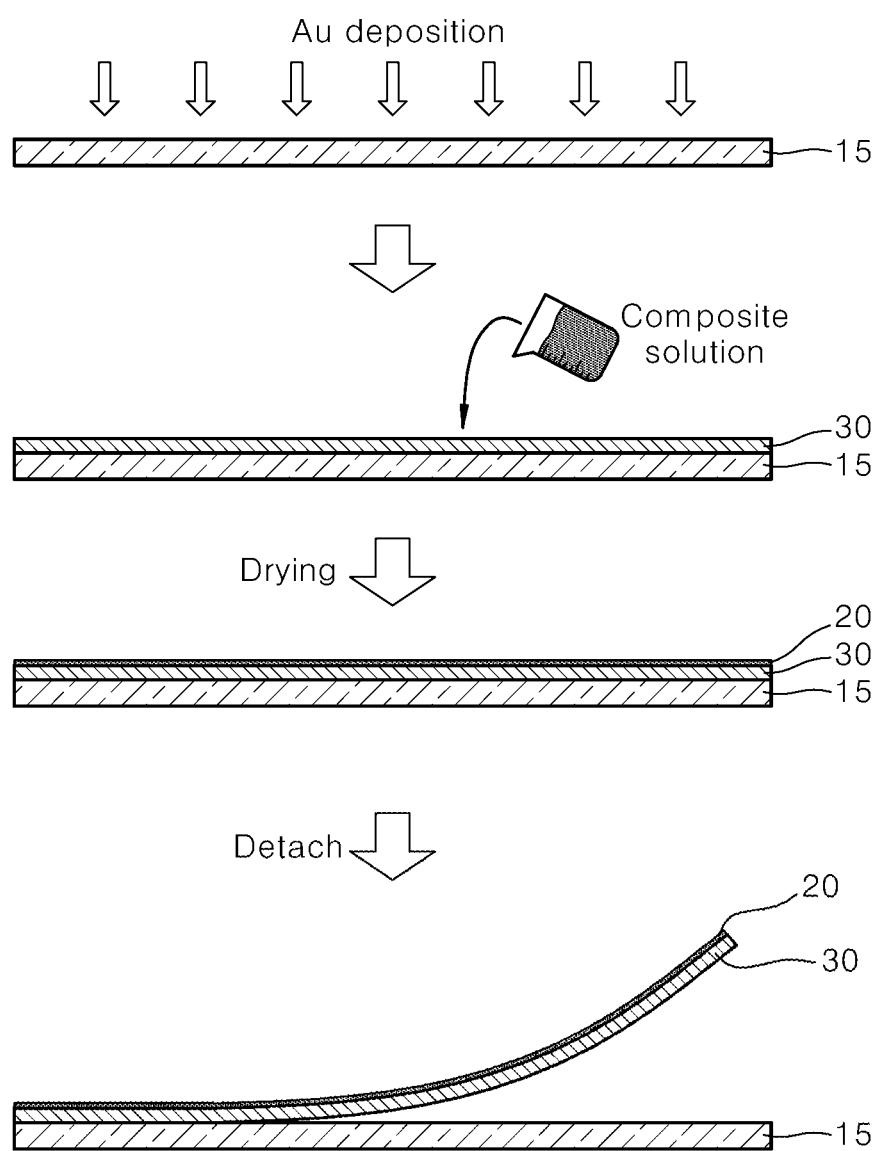
FIG. 2 is a flowchart illustrating a method of manufacturing an electrode of a bidirectional self-healing neural interface according to an embodiment of the present invention.
Figure 11:
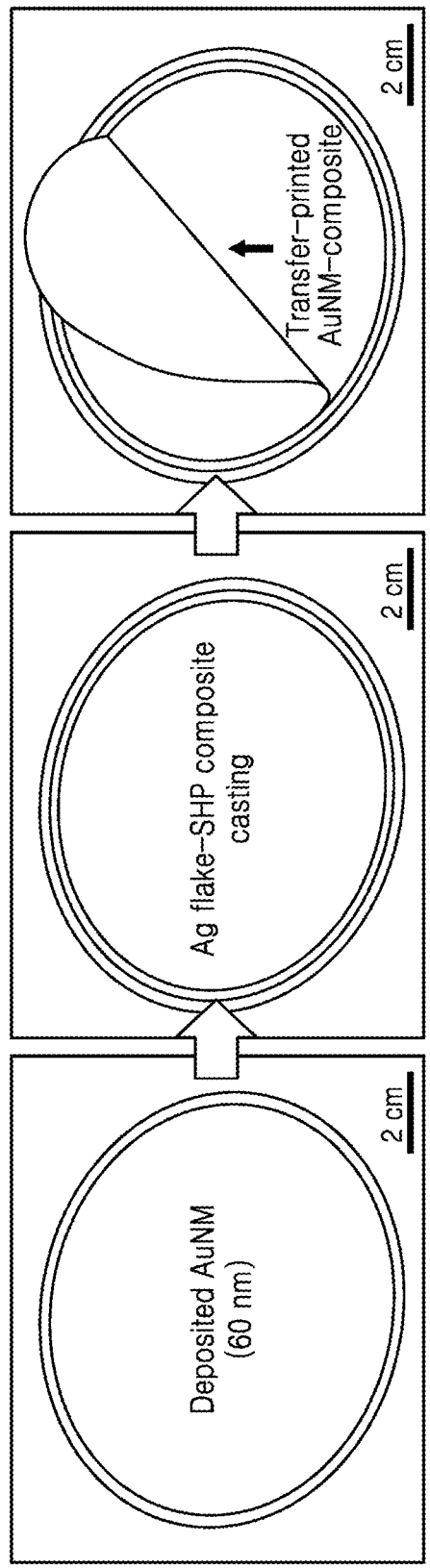
FIG. 11 shows a process of manufacturing a neural electrode of a bidirectional self-healing neural interface according to an embodiment of the present invention.

FIG. 2 is a conceptual diagram of a process of manufacturing a conductive polymer composite thin-film to which an Au nanomembrane is transferred. FIG. 11 shows the thin-film manufactured thereby. In FIG. 2, for transfer-printing the Au nanomembrane (hereinafter, referred to as 'AuNM'), an AuNM 30 having a thickness of 60 nm was first deposited on a silicon dioxide wafer substrate 15 using an E-beam evaporator (manufactured by ULVAC Co.). Then, an Ag flake-SHP mixed solution having an appropriate viscosity was poured onto the AuNM-attached wafer. After evaporating a solvent (chloroform) therefrom by drying for 12 hours, a thin-film of a conductive polymer composite 20 including a self-healing polymer and electrical conductor particles was formed thereon. The thin-film of the conductive polymer composite 20 on which the AuNM 30 was conformally transfer-printed (hereinafter, referred to as 'AuNM-composite') was separated from the substrate 15.

In order to connect the AuNM-composite electrode to the neural signal recoding amplifier, a metal pad prepared by sequentially stacking Ti, Cu, and Au on a PI substrate was introduced. The pad with a width of 1 mm and a length of 4 mm has holes each having a width of 0.35 mmm and a length of 2 mm for self-bonding between the AuNM-composite and the elastic substrate (hereinafter, referred to as 'SHP substrate'). The PI/Ti/Cu/Au layers had thicknesses of 80/5/30/10 nm, respectively. After the pad was self-bonded between the AuNM-composite layer (having a length of 10 mm, a width of 1.5 mm, and a thickness of 0.3 mm) and the SHP substrate layer, one end of the pad was soldered by a Teflon-coated wire to be connected to the neural signal recoding amplifier. The a PI film (Kapton tape, Dupont, thickness of 0.08 mm), as a substrate support layer, was formed on the upper surface of the SHP substrate, and the SHP substrate (having a length of 35 mm, a width of 15 mm, and a thickness of 0.25 mm) was disposed on an upper surface of the PI film, followed by self-bonding.

A length of the electrode exposed for interfacing nerves was set to 6 mm. The upper portion of the AuNM-composite electrode was encapsulated by using the SHP substrate (having a length of 9 mm, a width of 15 mm, and a thickness of 0.1 mm) to prepare a bidirectional self-healing neural interface (hereinafter, referred to as 'adaptive self-healing electronic epineurium (A-SEE)')

Comparative Example 1

A neural interface was prepared in the same manner as in the above-described example, except that the AuNM was directly deposited on the upper surface of the Ag flake-SHP composite disposed on a silicon wafer treated with octa-decyltrimethoxysilane (OTMS) by E-beam evaporation.

Comparative Example 2

A neural interface was prepared in the same manner as in the above-described example, except that a composite thin-film was prepared by pouring the Ag flake-SHP mixed solution onto a silicon dioxide wafer on which the AuNM was not deposited.

Experimental Example 1

Figure 3:
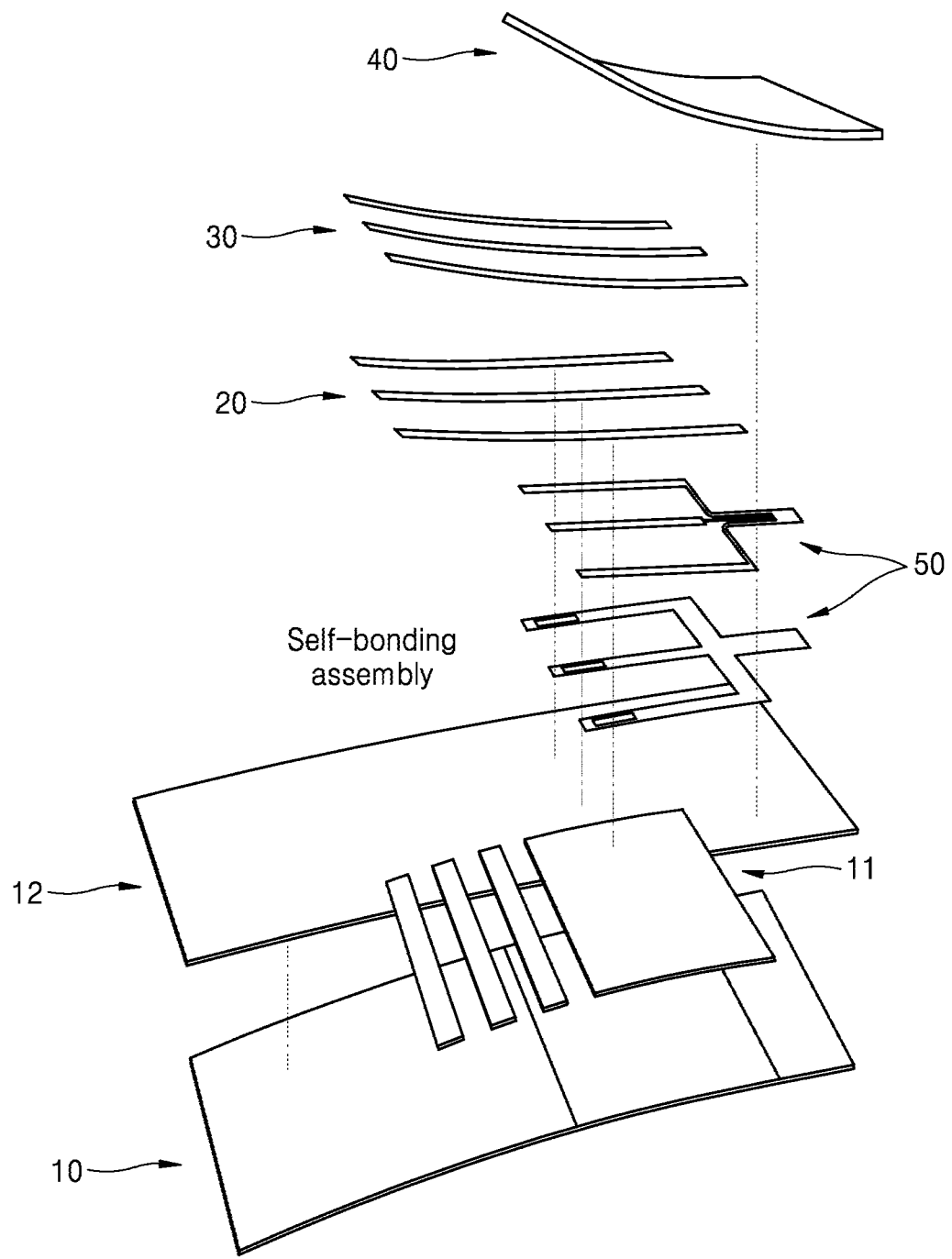
FIG. 3 is a diagram illustrating a structure of a bidirectional self-healing neural interface according to an embodiment of the present invention.

FIG. 3 shows a structure of A-SEE prepared in the above-described example. An assembly of a first elastic substrate 10, an AuNM-composite neural electrode E, and a second elastic substrate 40 was produced by self-bonding. FIG. 3 shows a structure in which a substrate support layer 11 and a third elastic substrate 12 are additionally formed on the first elastic substrate 10. The AuNM 30, the conductive polymer composite 20, and an Au metal pad 50 are disposed on the third elastic substrate 12. Subsequently, three transfer-printed AuNM 30-conductive polymer composite 20 neural electrodes are self-bonding onto the third elastic substrate 12 through the holes of a metal pad 50. Then, the structure was encapsulated by the second elastic substrate 40 disposed on the electrode E. The PI substrate support layer 11 formed between the two SHP substrates, i.e., between the first elastic substrate 10 and the third elastic substrate 12, serves a structural support for the SHP substrates and prevents formation of wrinkles in the A-SEE which may be caused by considerable mechanical stress received from adjacent muscles after implantation. Since the relatively hard and rigid PI intermediate layer may increase bending stiffness of the A-SEE, three separate PI films (having a length of 11 mm and a width of 1 mm) arranged at an interval of 1 mm were designed.

Experimental Example 2

Figure 4A:
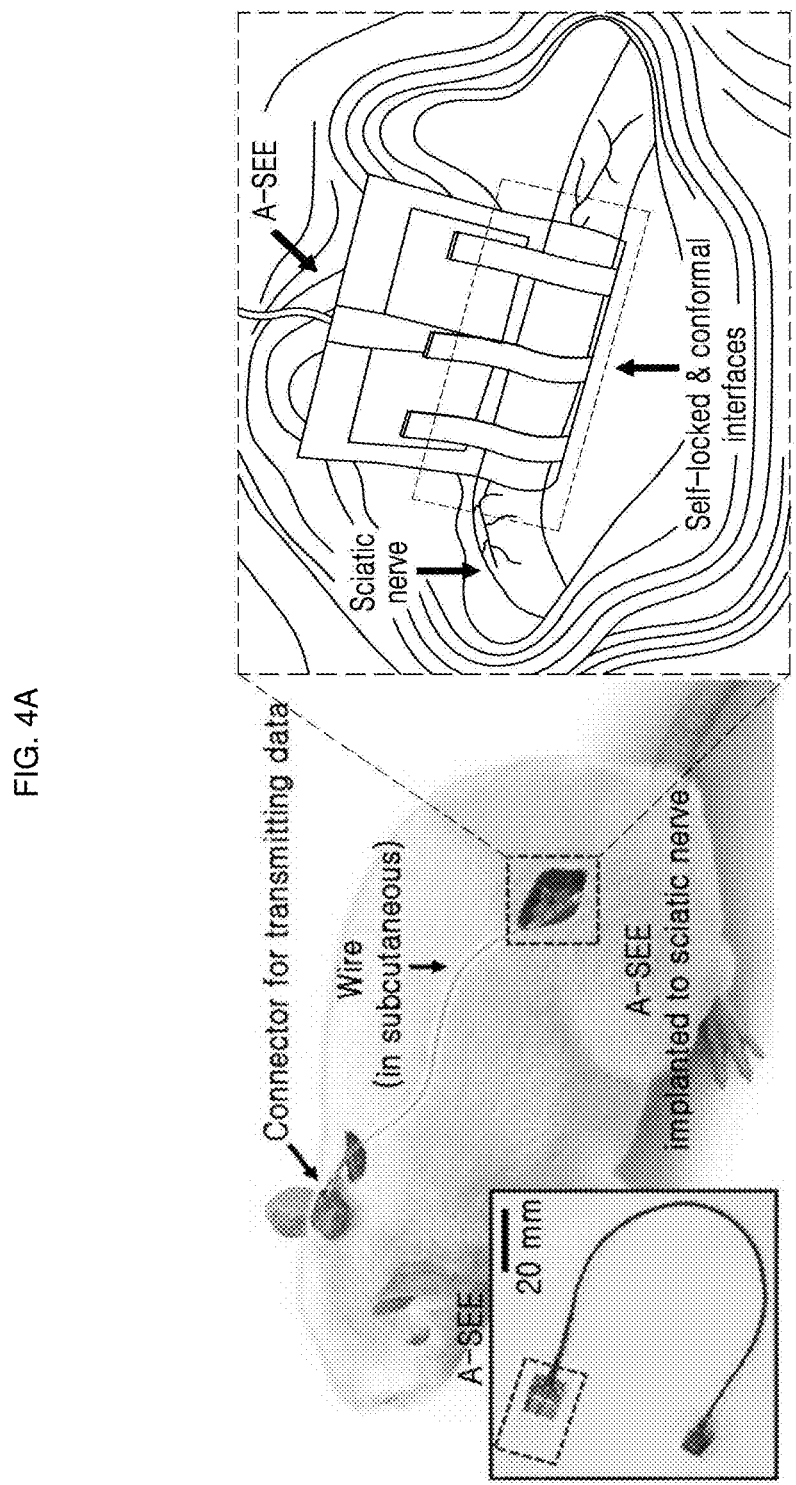
FIG. 4A is a structural diagram illustrating that a bidirectional self-healing neural interface according to an embodiment of the present invention is located near a sciatic nerve of a rat.
Figure 4B:
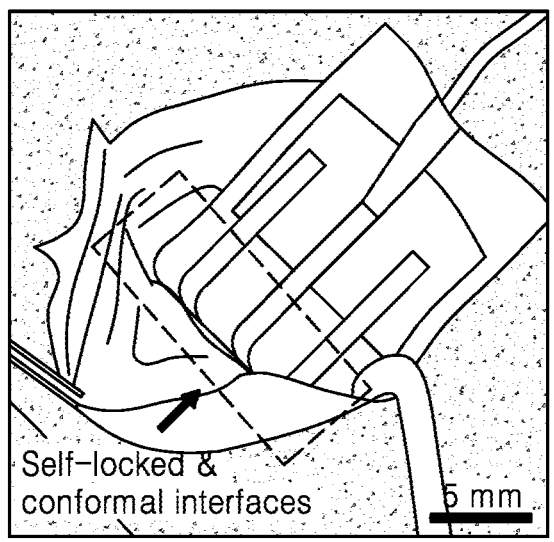
FIG. 4B shows a bidirectional self-healing neural interface according to an embodiment of the present invention applied to a sciatic nerve of a rat.

FIG. 4A is a structural diagram illustrating that an A-SEE is located near a sciatic nerve of a rat. FIG. 4B shows a sciatic nerve bonded to the A-SEE for 6 weeks. For implantation of the A-SEE according to an embodiment, a Sprague-Dawley rat (male, 300 g) was anesthetized by intraperitoneal injection using a Zoletil-Xylize cocktail (3:1 mg/kg). After a deep level of anesthesia was achieved, the skin was incised on the back of a foot to expose hind leg muscles. After biceps muscles of thigh and semitendinous muscles were identified, a sciatic nerve was exposed from muscles, and the A-SEE was located near the sciatic nerve. In this regard, tissue around the sciatic nerve was removed. The A-SEE was self-bonded to the sciatic nerve of the rat. No deformation or contraction was observed in the structure of the nerve tissue due to nerve tissue modulus adaptability of the A-SEE. Also, fibrosis was hardly observed in a neural-electronic interface indicating that no foreign body reactions or immune-responses occurred.

Experimental Example 3

Figure 5:
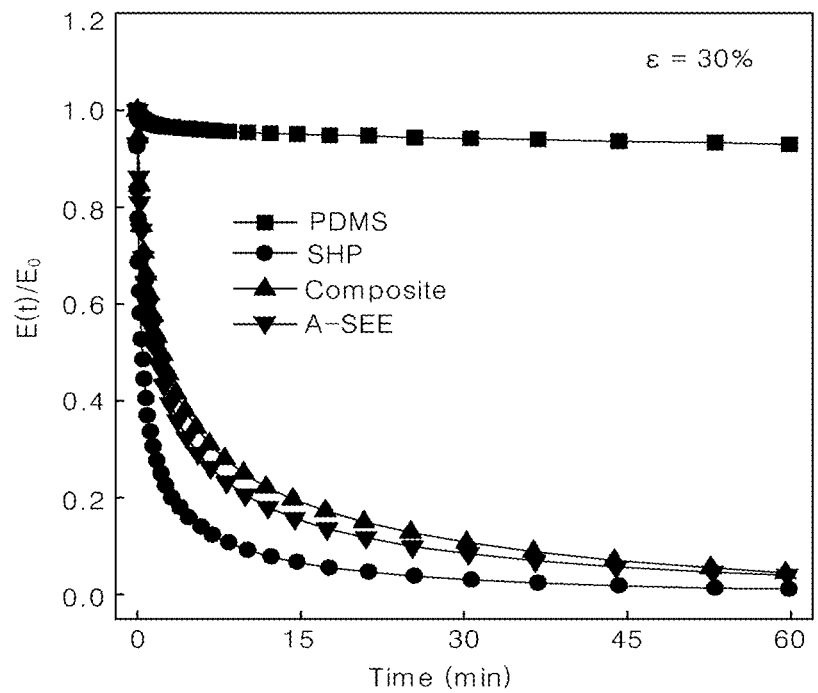
FIG. 5 shows stress relaxation properties of a bidirectional self-healing neural interface according to an embodiment of the present invention.
Figure 6:
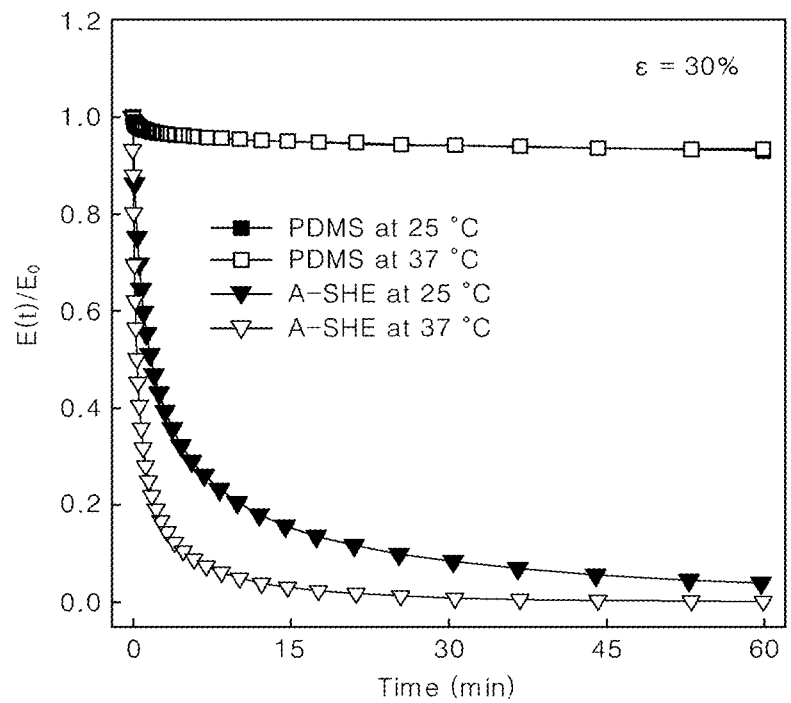
FIG. 6 shows stress relaxation properties of a bidirectional self-healing neural interface according to an embodiment of the present invention with respect to temperature.

FIGS. 5 and 6 show stress relaxation properties of the AuNM composite according to an embodiment. For dynamic mechanical analysis (DMA), a SHP film (thickness of 0.3 mm), an AuNM-Ag flake-SHP composite film (thickness of 0.3 mm), and an A-SEE film having a thickness of 0.9 mm prepared by bonding two SHP films (thickness of 0.3 mm) and an AuNM-Ag flake-SHP composite film (thickness of 0.3 mm) were prepared. In addition, a PDMS film (Sylgard 184, 1:20 PDMS:weight ratio of crosslinking agents) having a thickness of 0.3 mm, a length of 10 mm, and a width of 5 mm was prepared. Each sample was stretched to a tensile strain of 30% at a stretching rate of 50% strain/min, and tensile stress at the strain was measured for 60 minutes by using a DMA Q800 (TA Instruments).

FIG. 5 shows dynamic mechanical analysis results. It may be confirmed that tensile strength applied to the SHP, the AuNM-Ag flake-SHP composite, and the A-SEE may extremely be relaxed over time when compared to PDMS. FIG. 6 shows stress relaxation properties of the A-SEE and the PDMS measured at two different temperatures (at 25° C. and 37° C.). It may be confirmed that stress relation performance may further be improved as the temperature increases. Since strain energy is efficiently released from the dynamically cross-linking SHP matrix, the neural electronic interface is not sensitive to deformation without compressive stress.

Experimental Example 4

Figure 7:
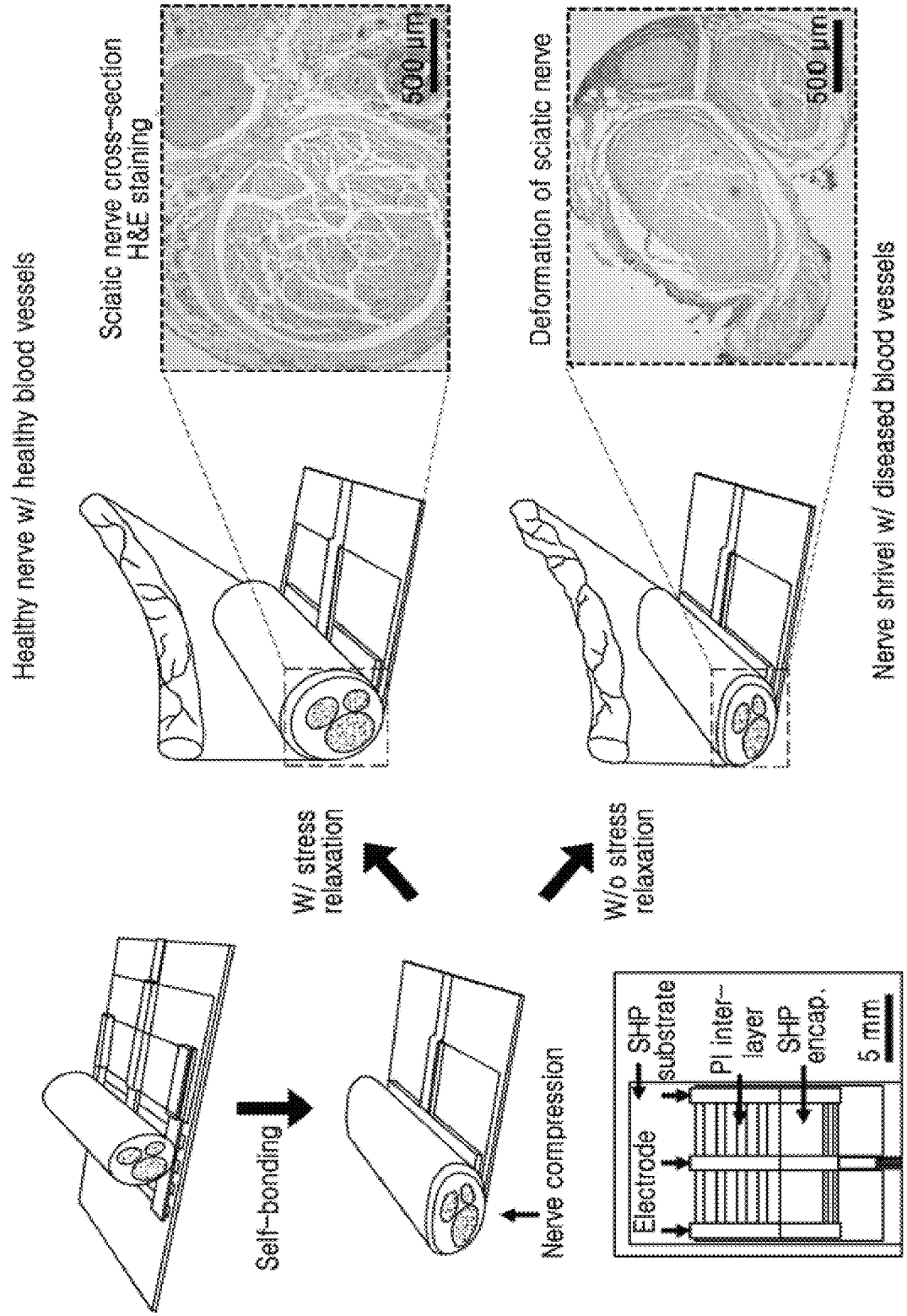
FIG. 7 shows a self-bonding structure and stress relaxation properties of a bidirectional self-healing neural interface according to an embodiment of the present invention.

FIG. 7 shows a structure to which the A-SEE is self-bonded. The A-SEE is self-locked while being implanted into a nerve without an additional suturing or closing process to form a self-bonding assembly. The "nerve tissue modulus adaptability" based on stress relaxing properties significantly reduce mechanical modulus mismatch in biological and non-biological interfaces so that the A-SEE is more suitable for chronic bidirectional peripheral neural interfaces than conventional material-driven devices. While an original structure was maintained in a rat after one week from implantation of the SHP, deformation of a nerve structure induced by compressive stress was observed in the interface with PDMS.

Experimental Example 5

Figure 8:
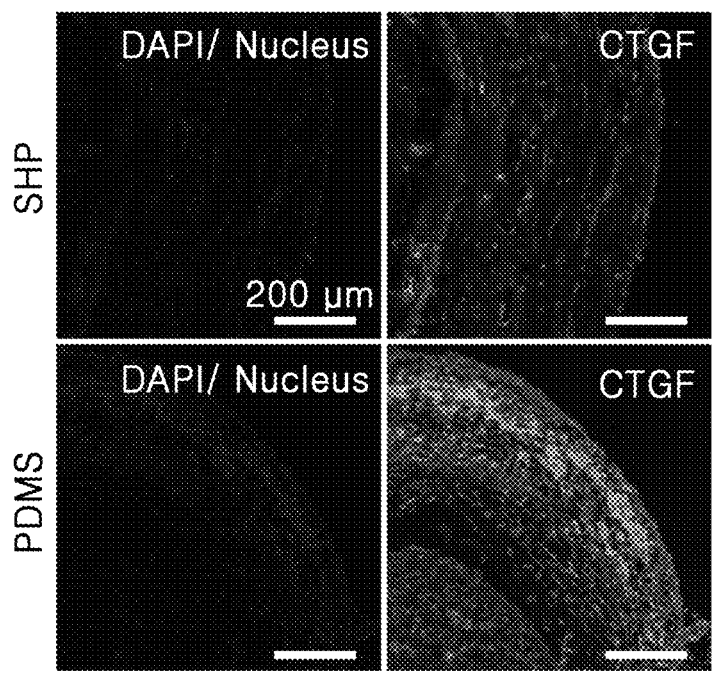
FIG. 8 shows stress relaxing properties of a bidirectional self-healing neural interface according to an embodiment of the present invention observed in a tissue level.

FIG. 8 shows results of using a connective tissue growth factor (CTGF) as a response index of nerve tissue with respect to the degree of compressive stress in order to further verify the stress relaxation performance of the A-SEE in the tissue level. The CTGF is known to be over-expressed by high pressure (external pressure, hypertension) and fibrous diseases to promote extracellular matrix production and thereby inducing cell death. It was confirmed that expression of the CTGF in the nerve tissue to which the SHP having a high degree of relaxing compressive stress was far lower than expression thereof in the nerve tissue to which the PDMS was applied.

Figure 9:
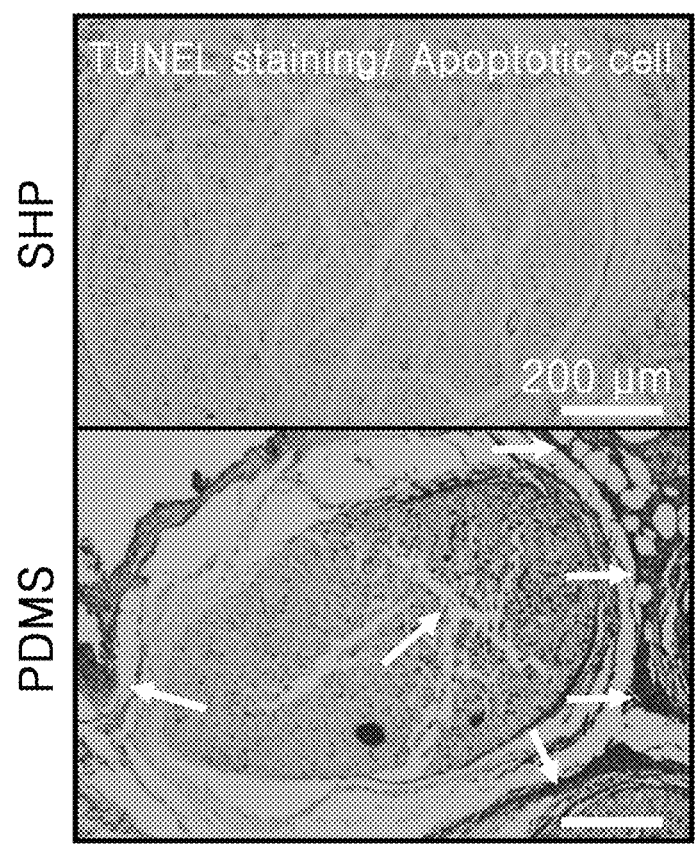
FIG. 9 shows TUNEL analysis results of a bidirectional self-healing neural interface according to an embodiment of the present invention.

FIG. 9 additionally shows TUNEL analysis results of the A-SEE. Based on the results of Terminal deoxynucleotidyl transferase dUTP nick end labeling (TUNEL) analysis capable of staining dead cells, it was confirmed that the nerve tissue was less damaged and functions thereof were maintained in the case where compressive stress was relaxed by the SHP when compared with the PDMS control.

Figure 10:
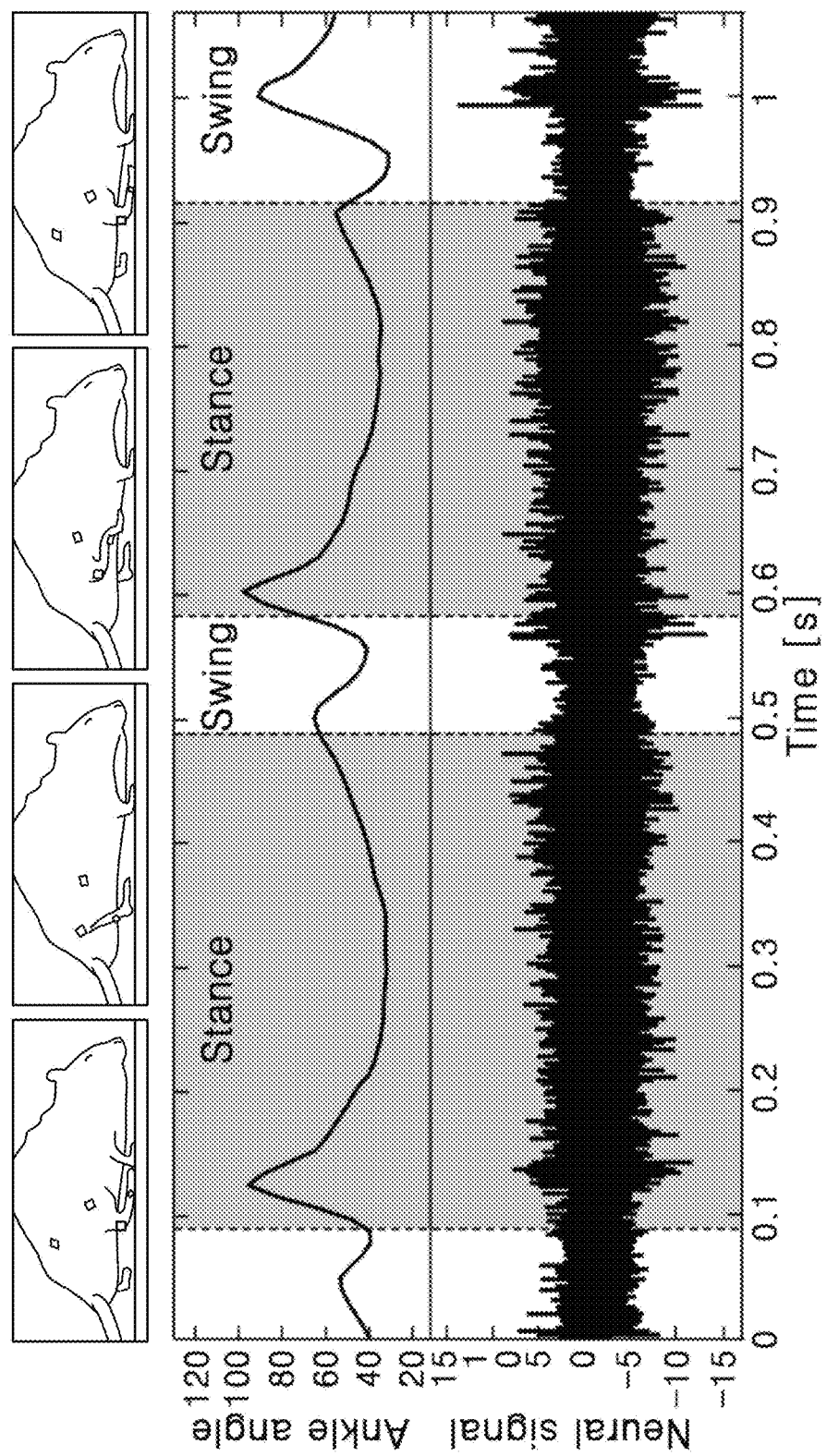
FIG. 10 shows analysis results of mechanical-dynamic properties of a bidirectional self-healing neural interface according to an embodiment of the present invention.

FIG. 10 shows mechanical-dynamic properties of the A-SEE. Even after 6 weeks from implantation, measurement of neural signals and joint kinematic analysis thereof were successfully performed in awake mice. It was confirmed that long-term peripheral neural signal measurement by using the A-SEE was superior to performance obtained by conventional cuff-type interfaces.

Experimental Example 6

Figure 12:
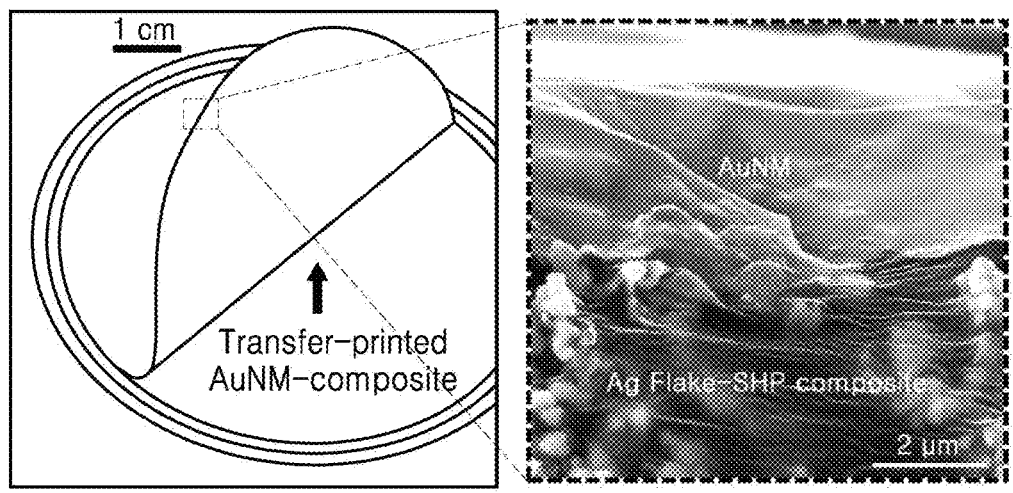
FIG. 12 is an SEM image of a bidirectional self-healing neural interface according to an embodiment of the present invention.
Figure 30:
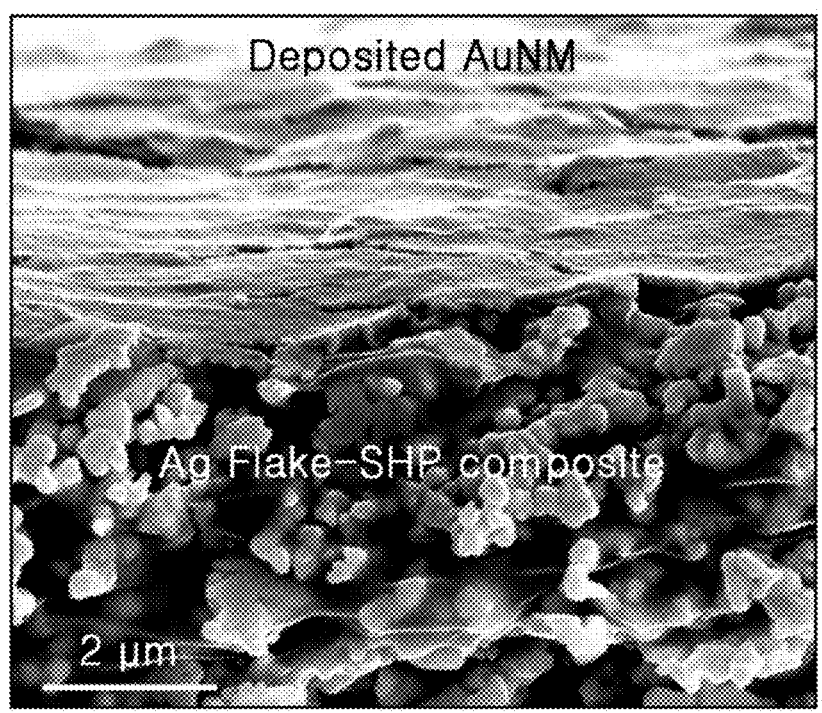
FIG. 30 is an SEM image of a composite according to a comparative example.

FIG. 12 is an SEM image of a cross-section of an A-SEE composite according to an embodiment of the present invention. In order to observe an interface between the Ag flake-SHP composite and AuNM transfer-printed thereonto and an interface between the Ag flake-SHP composite and AuNM deposited thereon, a field emission scanning electron microscope (FE-SEM, Inspect F50, FEI Co.) was used. Each of the AuNM-Ag flake-SHP composite films were cut by a razor blade to obtain a transverse section and coated with platinum before imaging. FIG. 12 shows the transfer-printed AuNM prepared in the above-described example and no crack was observed. However, FIG. 30 show the deposited AuNM-Ag flake-SHP composite prepared in Comparative Example 1, cracks were observed on the surface of the AuNM.

Experimental Example 7

Figure 13:
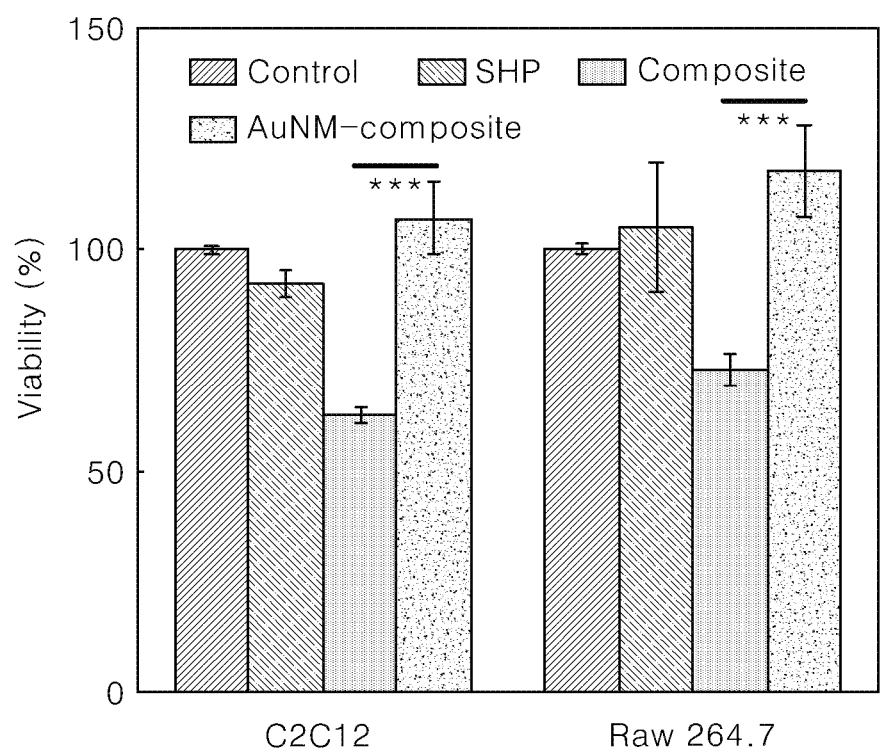
FIG. 13 shows biocompatibility test results of a bidirectional self-healing neural interface according to an embodiment of the present invention.
Figure 29:
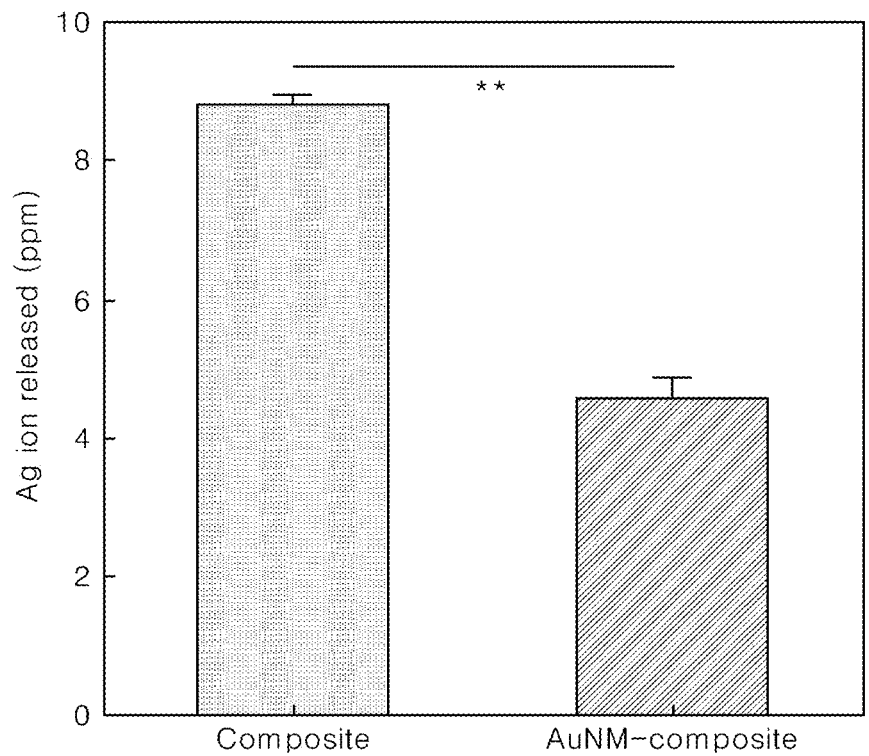
FIG. 29 shows stability test results of a bidirectional self-healing neural interface according to an embodiment of the present invention.

The AuNM-composite hybrid structure according to the above-described example may impart biocompatibility with regard to cytotoxicity induced by Ag ions released from the composite. FIG. 13 shows results of confirmed actual cytotoxicity. Tests were performed using immune cells (RAW 264.7) and muscle fiber cells (C2C12) which are known to closely interact with the surface of the electrode after in vivo electrode implantation. As a result of identifying viability after cultivating for one week, the two cell lines cultured with the AuNM-composite exhibited significantly high viability when compared with the other sample groups, indicating that the AuNM may efficiently inhibit release of Ag ions. FIG. 29 shows concentrations of released Ag ions in actual culture media measured by inductively coupled plasma mass spectrometry (ICP-MS). The AuNM composite exhibited the lowest Ag ion concentration, which is consistent with the results described above.

Experimental Example 8

Figure 31A:
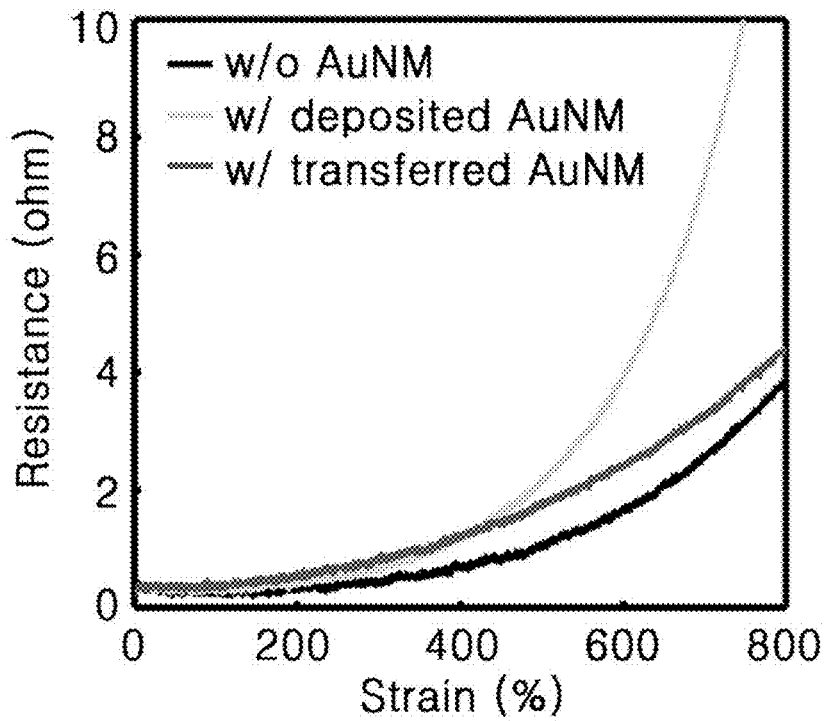
FIG. 31A is a graph illustrating resistance of a bidirectional self-healing neural interface according to an embodiment of the present invention.
Figure 31B:
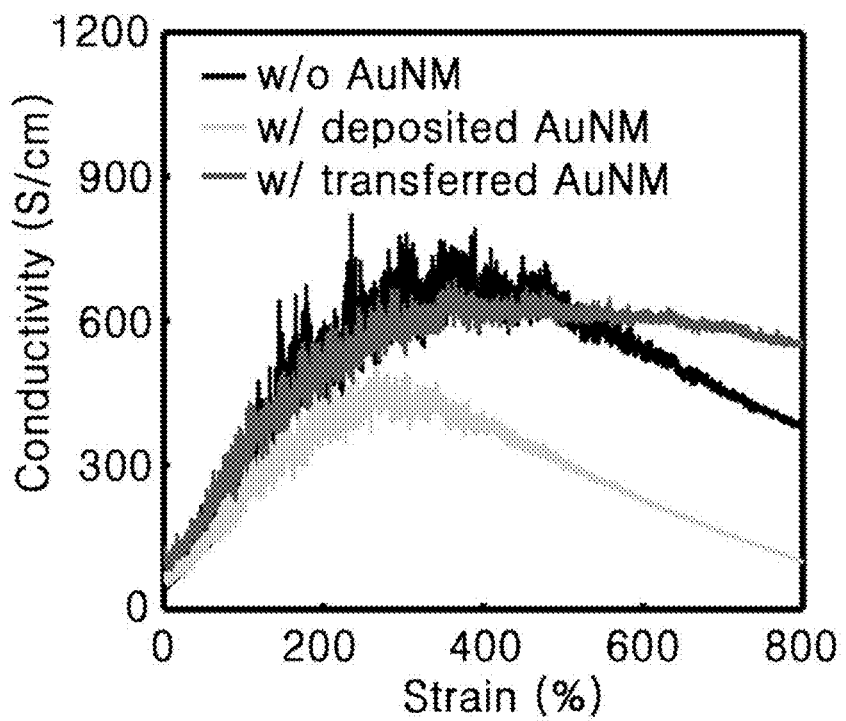
FIG. 31B is a graph illustrating conductivity of a bidirectional self-healing neural interface according to an embodiment of the present invention.

FIG. 31A shows resistances of composite materials without the AuNM (Comparative Example 2), deposited with the AuNM (Comparative Example 1), and transfer-printed with the AuNM (example of the present invention), and FIG. 31B shows a conductivity-strain curve. Electrical performance of the deposited AuNM-composite was far lower than that of the transfer-printed AuNM-composite. This may be because the deposited AuNM-composite had poor interface stability and thermal properties deteriorated during a deposition process as confirmed in FIG. 30.

Figure 14:
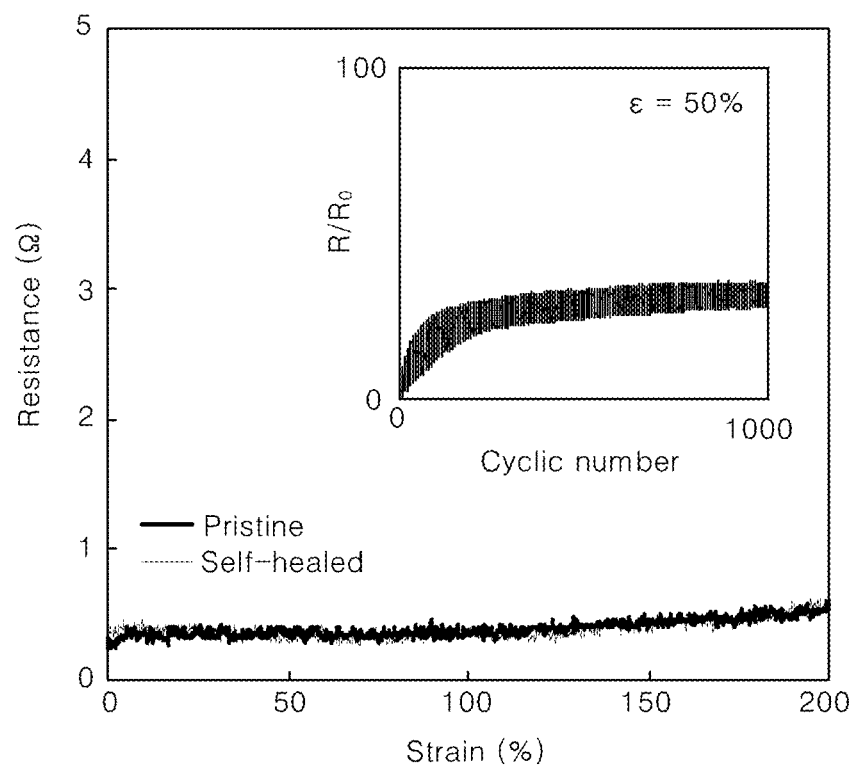
FIG. 14 shows stretching characteristics of a bidirectional self-healing neural interface according to an embodiment of the present invention.
Figure 15:
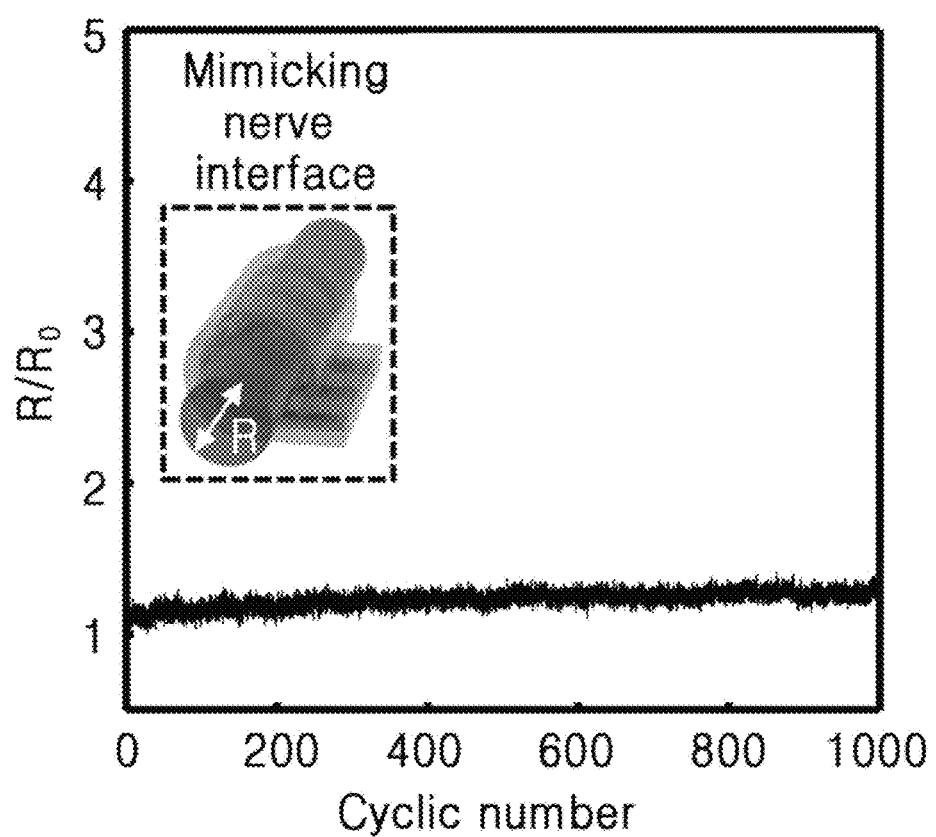
FIG. 15 shows electrical performance of a bidirectional self-healing neural interface according to an embodiment of the present invention.

FIG. 14 shows stretching characteristics of a bidirectional self-healing neural interface according to an embodiment of the present invention. With regard to the stretching characteristics of the transfer-printed AuNM-composite, electrical conductivity continue to increase as the electrode is stretched. This phenomenon may be explained by dynamic movement of conductive particles in a deformed SHP matrix. The AuNM exceptionally exhibited the same stretch performance in the AuNM composite self-healed due to dynamic characteristics of the SHP. Stretching durability (1000 cycles) at a tensile strain of 50% was also confirmed.

Figure 32A:
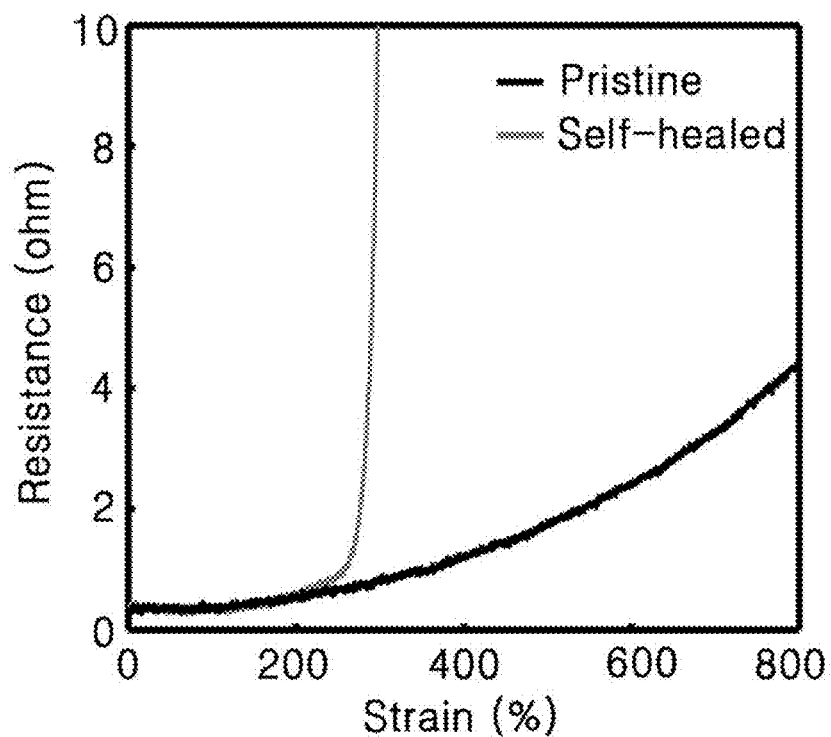
FIG. 32A is a graph illustrating resistance-strain characteristics of a bidirectional self-healing neural interface according to an embodiment of the present invention.
Figure 32B:
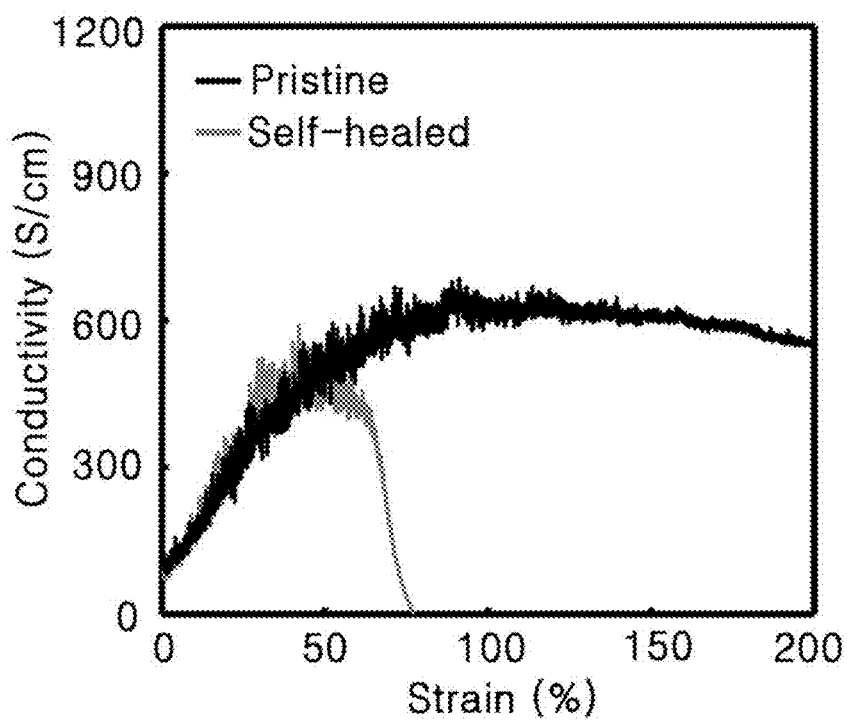
FIG. 32B is a graph illustrating conductivity-strain characteristics of a bidirectional self-healing neural interface according to an embodiment of the present invention.

FIG. 32A shows resistance with respect to strain of the AuNM-Ag flake-SHP composite, and FIG. 32B shows conductivity with respect to strain. Resistance-strain characteristics before the AuNM-composite was damaged (pristine) and after the damage was self-healed are shown. The AuNM-composite that is completed damaged and then self-healed exhibited similar electrical performance up to a strain of 200%. Based on the self-healing efficiency of the AuNM-composite, it was confirmed that self-healability of the conductive polymer composite was not reduced by the AuNM.

Figure 33:
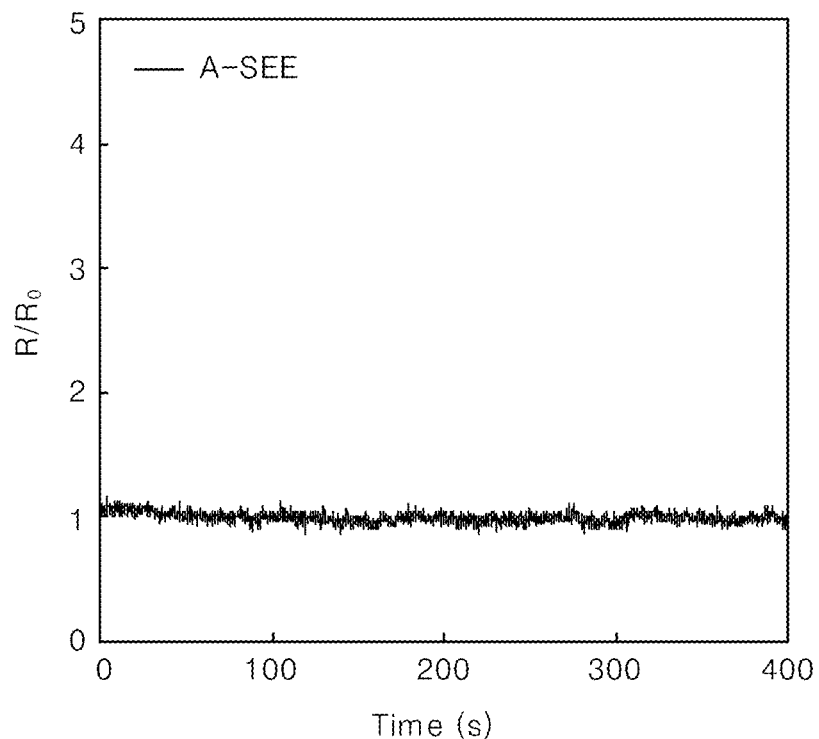
FIG. 33 is a graph illustrating electrical stability of a bidirectional self-healing neural interface according to an embodiment of the present invention.

FIG. 33 shows electrical stability of a bent A-SEE in a test that mimics a neural-electronic device. As a result of standardizing resistance variation of the A-SEE bent in accordance with a bend radius of a sciatic nerve (0.5 mm) of a rat, it was confirmed that resistance of the A-SEE was constantly maintained in the bent state.

Figure 16:
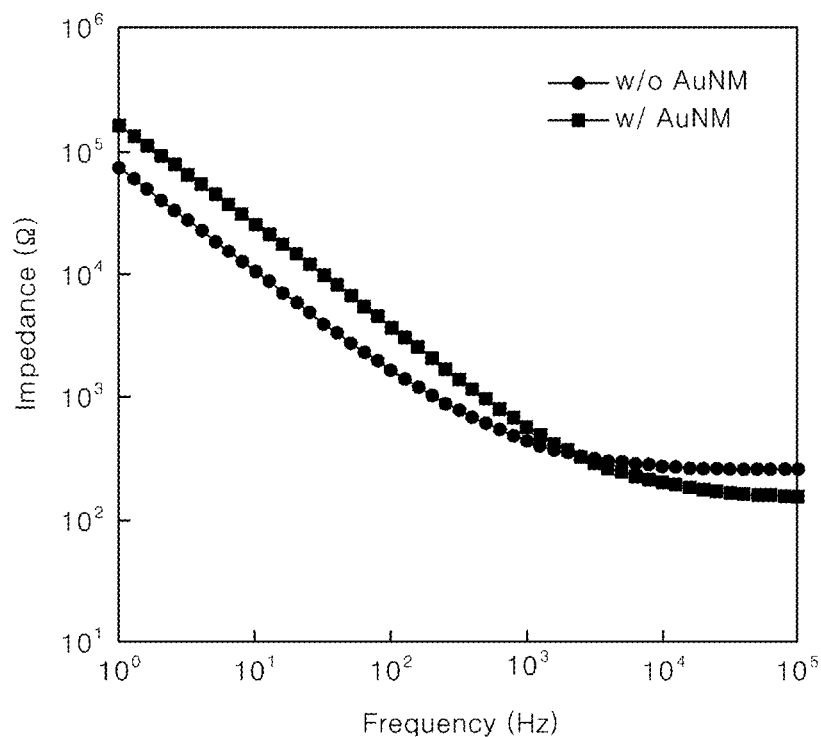
FIG. 16 shows electrochemical impedance of a bidirectional self-healing neural interface according to an embodiment of the present invention.
Figure 17:
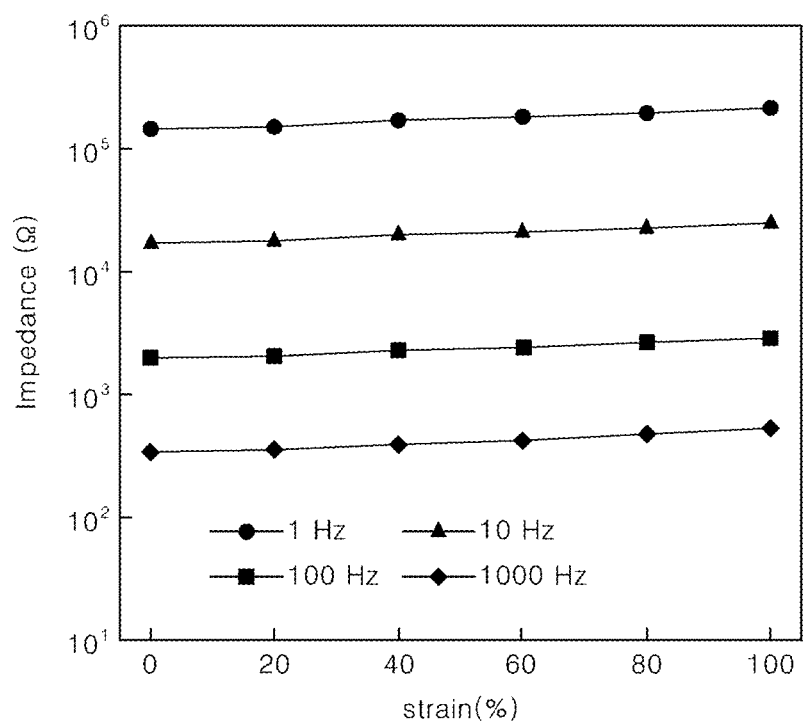
FIG. 17 shows electrochemical impedance of a bidirectional self-healing neural interface according to an embodiment of the present invention by stretching.

FIGS. 16 and 17 shows electrochemical impedance of a bidirectional self-healing neural interface according to an embodiment of the present invention. The A-SEE was stretched to a strain of 100% while maintaining stable electrochemical impedance. In particular, it was confirmed that low impedance values in the range of 347.6 ohm to 526.5 ohm were obtained under a strain of 0% to 100% at 1 kHz. This indicates that the A-SEE may contribute to realization of the bidirectional neural interface.

Figure 34:
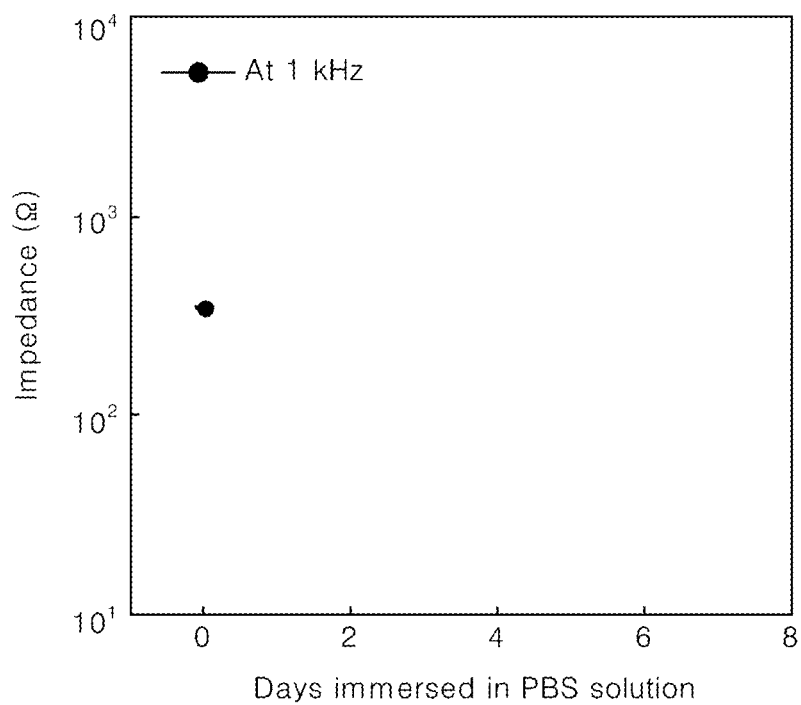
FIG. 34 shows electrochemical impedance of a bidirectional self-healing neural interface according to an embodiment of the present invention.

FIG. 34 shows impedance of the A-SEE measured in a PBS solution using a potentiometer (CHI 760C, CH Instruments) to observe impedance stability of the A-SEE. An exposed area of each sample was 7.5 mm$^2$. A Pt wire was used as a counter electrode. Electrostatic electrochemical impedance spectroscopy was performed with a frequency of 1 Hz to 1 MHz and an amplitude of 10 mV. The A-SEE exhibited no change in impedance even when immersed in a phosphate buffered saline (PBS) solution for 7 days.

Figure 18:
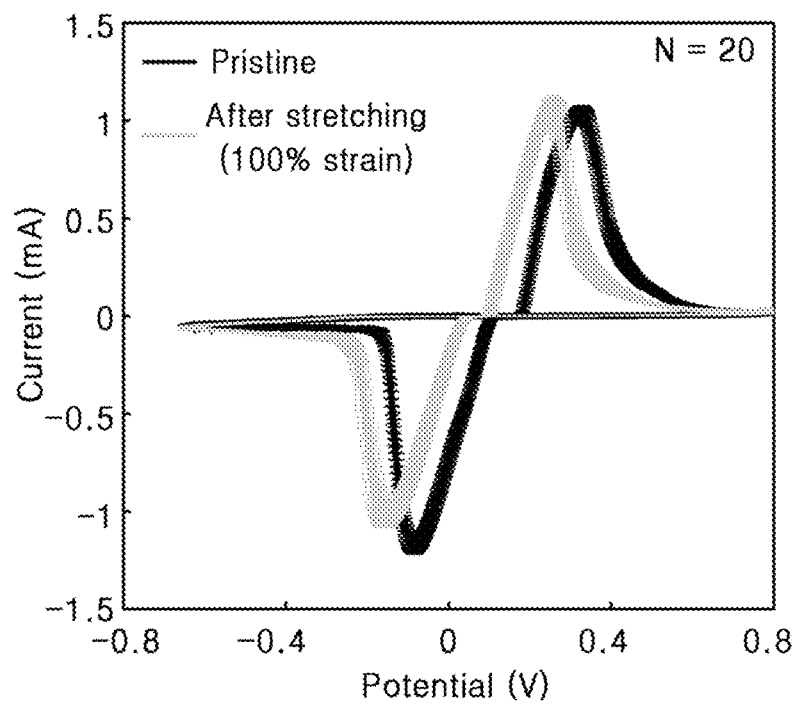
FIG. 18 shows results of cyclic voltammetry performed on a bidirectional self-healing neural interface according to an embodiment of the present invention at a strain of 100%.
Figure 35A:
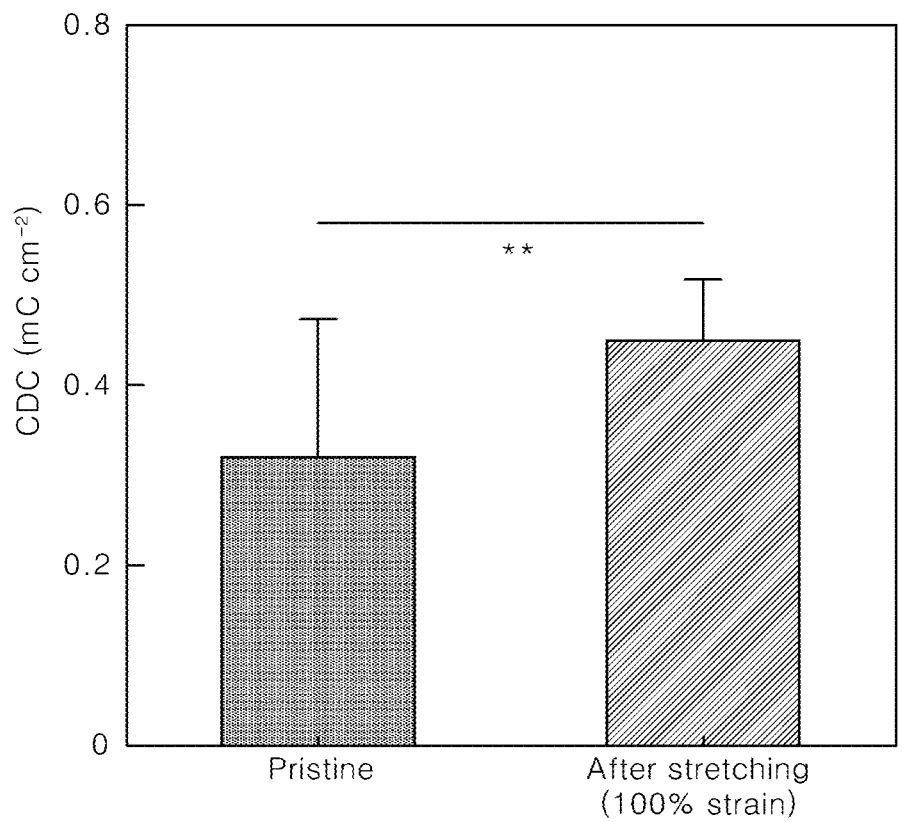
FIG. 35A shows charge delivery capacity (CDC) of a bidirectional self-healing neural interface according to an embodiment of the present invention calculated by cyclic voltammetry at a strain of 100%.
Figure 35B:
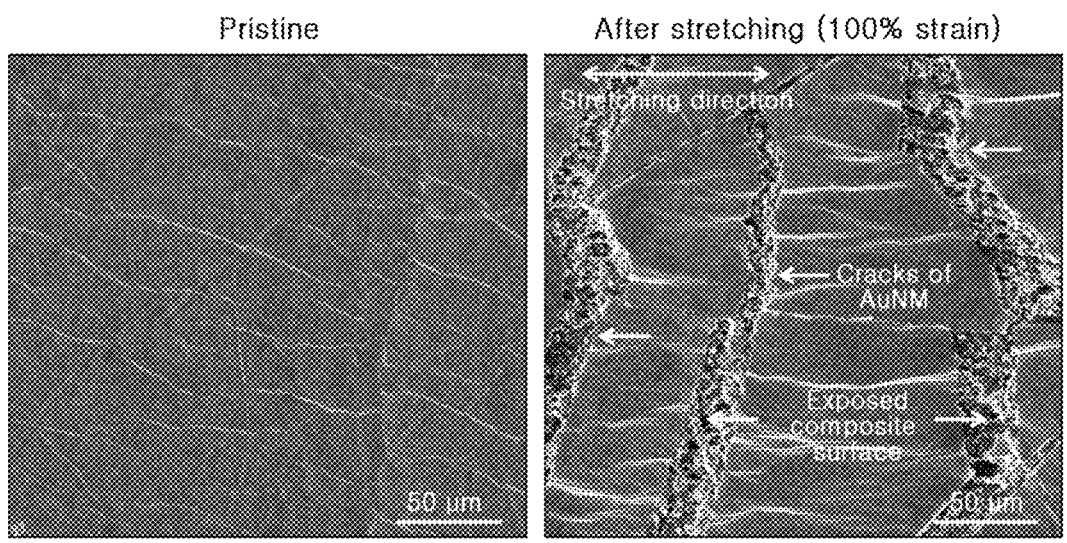
FIG. 35B shows a measurement process by cyclic voltammetry by deforming a bidirectional self-healing neural interface according to an embodiment of the present invention.

FIG. 35A shows charge delivery capacity (CDC) calculated by cyclic voltammetry at a strain of 100%. FIG. 35B shows a measurement process by cyclic voltammetry (CV). For the CV measurement, an Ag/AgCl electrode (BASiAg/AgCl/3M NaCl) was used as a reference electrode. Results obtained in a current curve in a potential range of −0.65 V to 0.8 V at a scan rate of 100 mV/s are shown in FIG. 18. FIG. 35A shows CDC values of the A-SEE before and after stretching. In FIG. 35A, the charge delivery capacity (CDC) was calculated based on the obtained CV curve (20 cycles) illustrated in FIG. 18. Even after stretched to a stretching strain of 100%, reduction of the CDC values of the A-SEE was not observed.

Experimental Example 9

Figure 19:
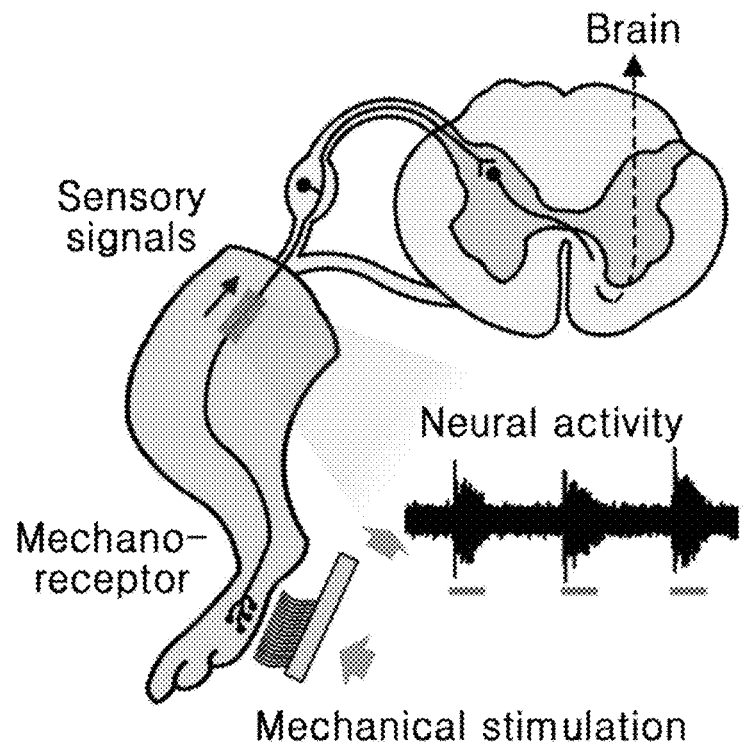
FIG. 19 shows a signaling system of a nervous system to which a bidirectional self-healing neural interface according to an embodiment of the present invention is applied.
Figure 20:
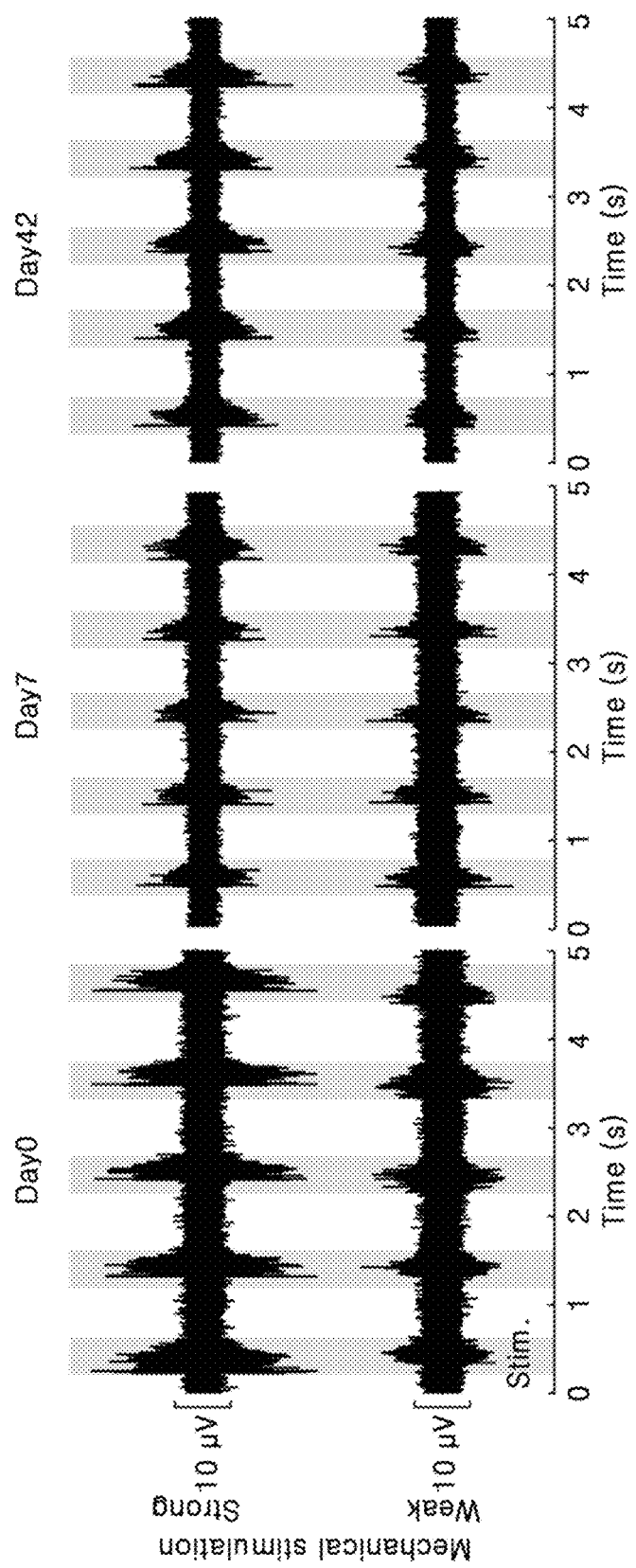
FIG. 20 shows sensory compound action potentials measured by implanting a bidirectional self-healing neural interface according to an embodiment of the present invention into a sciatic nerve of a rat.

FIG. 19 shows a signaling system of a nervous system to which the bidirectional self-healing neural interface according to an embodiment of the present invention is applied. In order to fully understand the signaling system of the nervous system, the A-SEE was inserted into a sciatic nerve of a rat and sensory compound action potentials (CAPs) generated by mechanical stimulus were measured. FIG. 20 shows strong (0.12 N/cm$^2$) and weak (0.03 N/cm$^2$) mechanical stimuli. Although the CAP amplitude was reduced at an early stage of injection (at day 7) due to scar formation by foreign body reactions, strong or weak neuromodulation was confirmed thereafter.

Experimental Example 10

Figure 21:
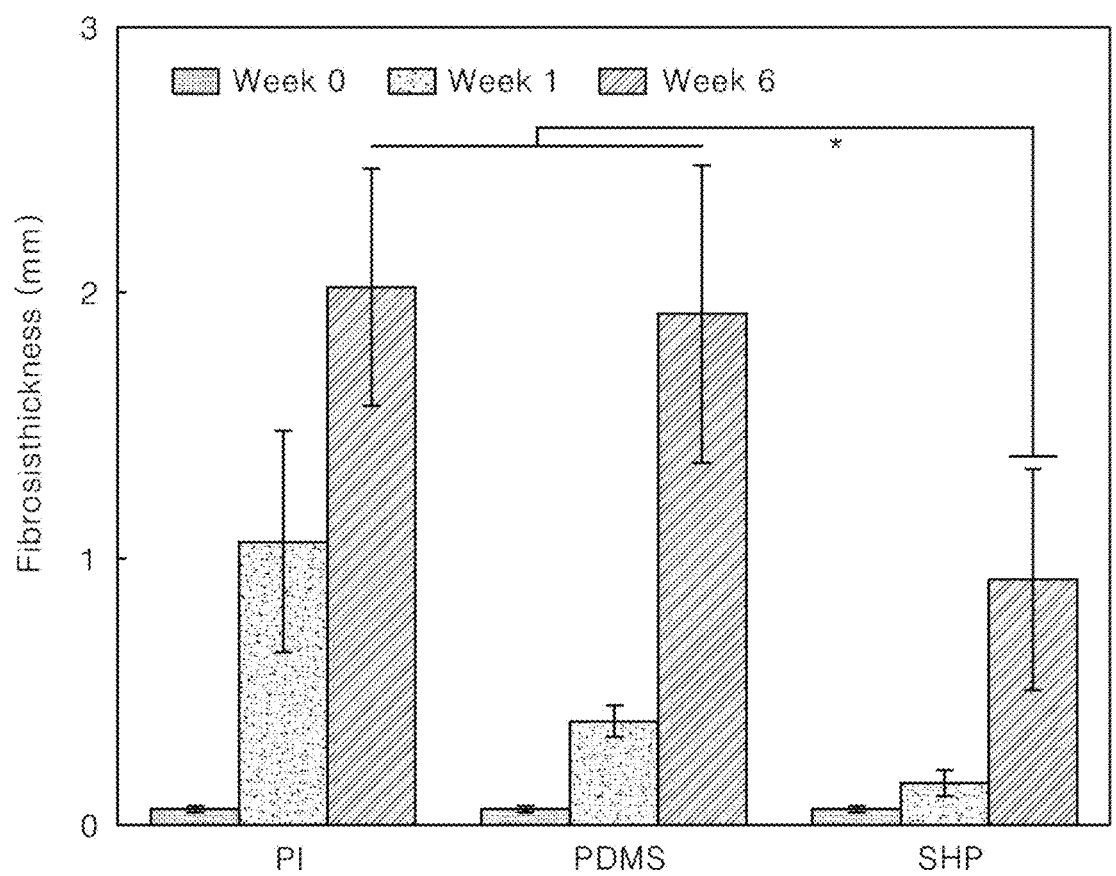
FIG. 21 shows thicknesses of fibrous tissue after 6 weeks from implantation of a bidirectional self-healing neural interface according to an embodiment of the present invention.

A modulus difference between the nerve tissue-electrode interface may induce immune responses in a living body. In order to identify immune responses in actual nerve tissue, nerve tissue was excised after 6 weeks from implantation of SHP, polyimide (PI), and PDMS and the degree of immune-responses was identified by histological staining. FIG. 21 shows thicknesses of fibrous tissue after 6 weeks from implantation of the bidirectional self-healing neural interface according to an embodiment of the present invention. The thickness of the fibrous tissue formed in the nerve tissue to which the SHP was applied was relatively small compare to the thicknesses of the fibrous tissue to which the PI and the PDMS were applied, respectively. It was histologically confirmed that such characteristics of the SHP enabled measurement of the neural signals for a long time.

Figure 36:
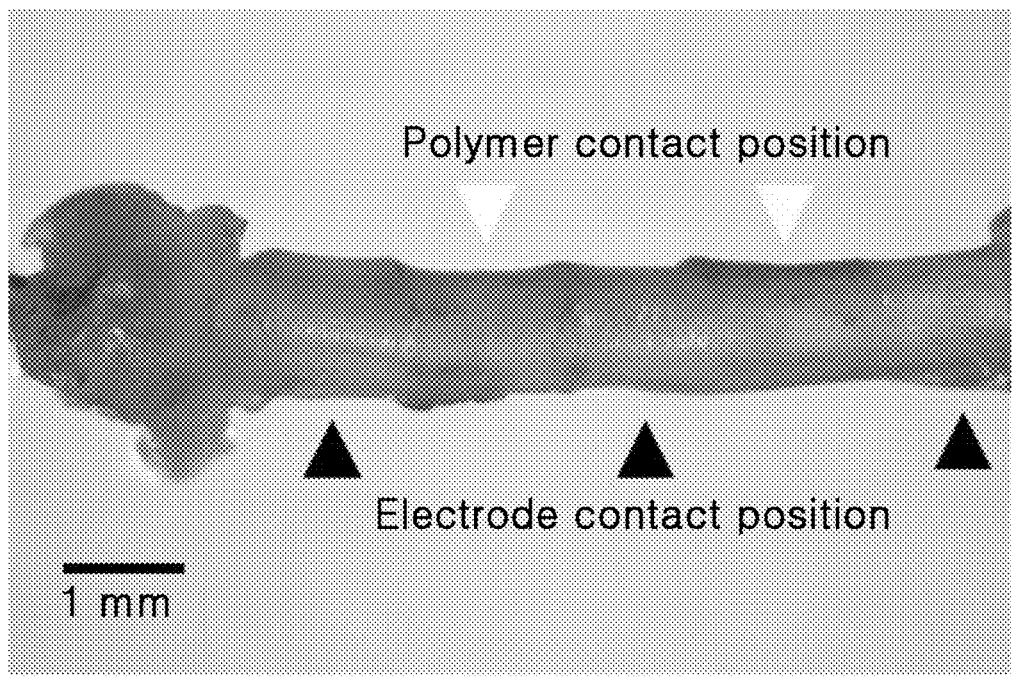
FIG. 36 is a photograph of a sciatic nerve of a rat to which a bidirectional self-healing neural interface according to an embodiment of the present invention is implanted for 6 weeks.

In FIG. 36, fibrosis was not observed in three regions (indicated by black triangles) interfaced with the electrode (AuNM-composite), but some fibrous tissue was formed near two regions (indicated by white triangles) interfaced with the SHP. This is mainly because of a topographic structure of the A-SEE. The three electrodes located on the SHP substrate were designed to protrude to be in close contact with the nerve (thickness of AuNM composite: 0.3 mm). Thus, immune cells and fibroblasts cannot move to a boundary between an amide electrode and a nerve. The close electrode-nerve boundary may contribute stable bidirectional neural signal recording and modulation for a long time without compressive stress.

Figure 37A:
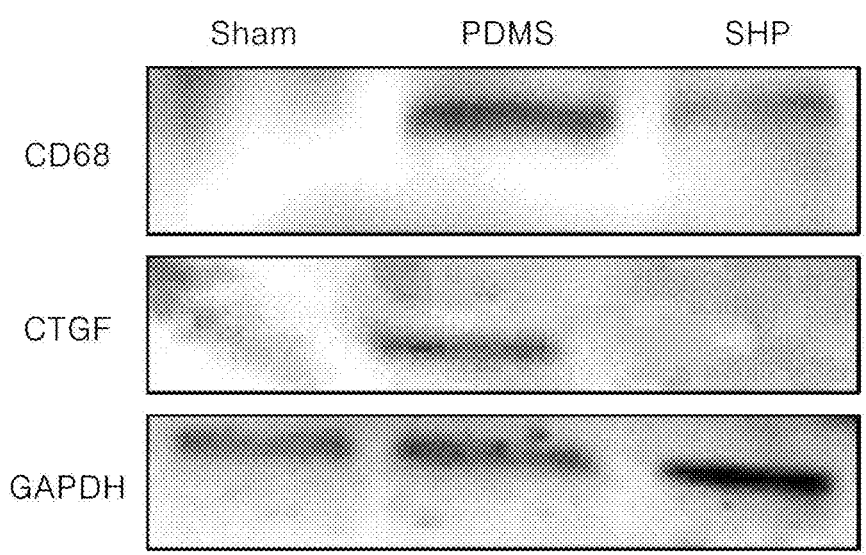
FIG. 37A shows western blotting results after implanting a bidirectional self-healing neural interface according to an embodiment of the present invention into a sciatic nerve of a rat.
Figure 37B:
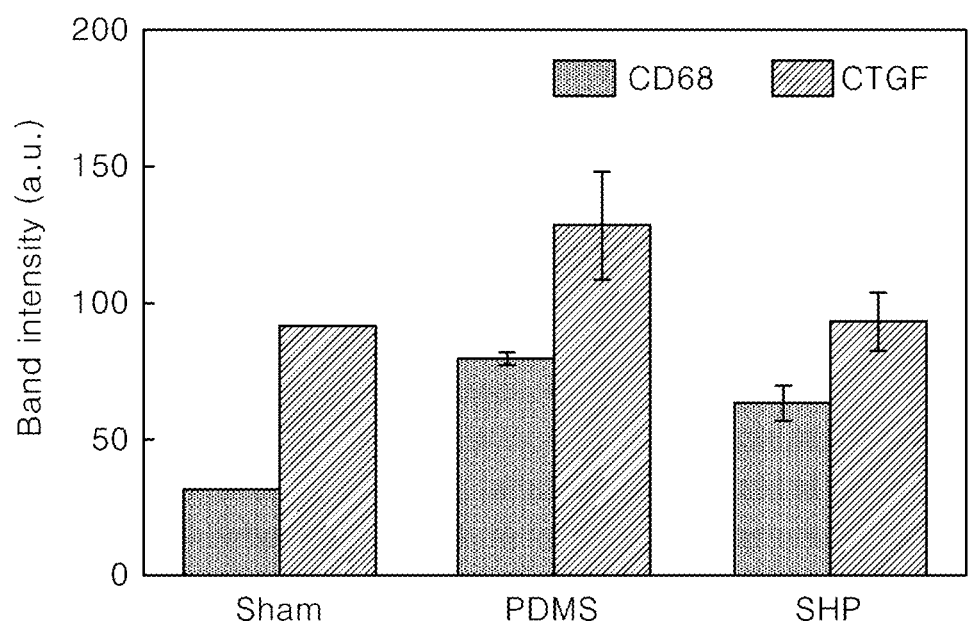
FIG. 37B is a graph illustrating western blotting results after implanting a bidirectional self-healing neural interface according to an embodiment of the present invention into a sciatic nerve of a rat.

FIG. 37A shows results of western blotting performed on CD68 and CTGF and it was confirmed that effects of stress relaxation properties of the PDMS and the SHP on protein expression levels in interferon nerve tissue. GAPDH protein was used as a control protein. FIG. 37B shows average band intensities of signals of CD68 and CTGF normalized by a GAPDH intensity value (n=3). Expression levels of CD68 and CTGF were the highest in the nerve tissue interfaced with the PDMS, indicating that continuous compressive stress induced by mechanical modulus mismatch between the PDMS and the nerve tissue cause over-expression of immune responses. Such results indicate that foreign body reactions may be minimized since the A-SEE adapts the modulus to the nerve tissue, and thus the A-SEE may be used as a stable neural interface for in vivo signal measurement for a long time.

Figure 38:
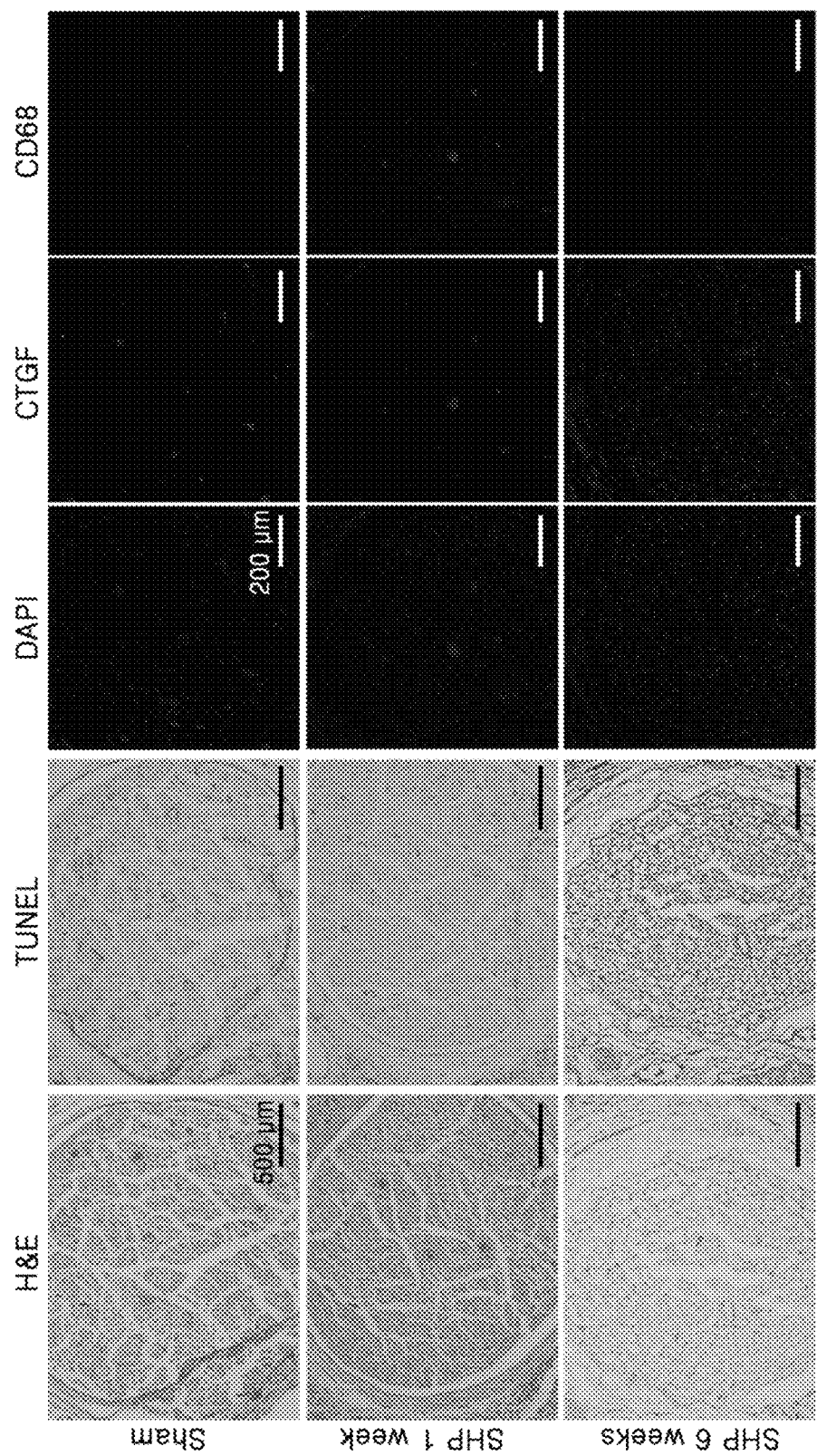
FIG. 38 shows immunoblotting results of a bidirectional self-healing neural interface according to an embodiment of the present invention.

FIG. 38 shows histological analysis results of a transvers section of a sciatic nerve of a rat after one week and six weeks from implantation of the SHP. H & E staining was used to identify morphological changes and scar tissue formation. According to TUNEL analysis, apoptotic cells may be stained in brown. After one week from implantation, it was confirmed that there were almost no deformation and damage in the nerve tissue induced by the SHP and functions thereof were maintained based on the H & E and TUNEL staining results. In addition, the expression levels of CTGF (green) and CD68 (red) proteins, which were fluorescence stained, in the SHP were similar to those observed in a control group (normal nerve tissue). Although a thickness of the fibrous scar tissue near a bundle of nerves slightly increased after six weeks when compared with that after one week, the shape and structure of the cells were maintained, indicating that neurons normally function during long-term monitoring.

Experimental Example 11

Figure 22:
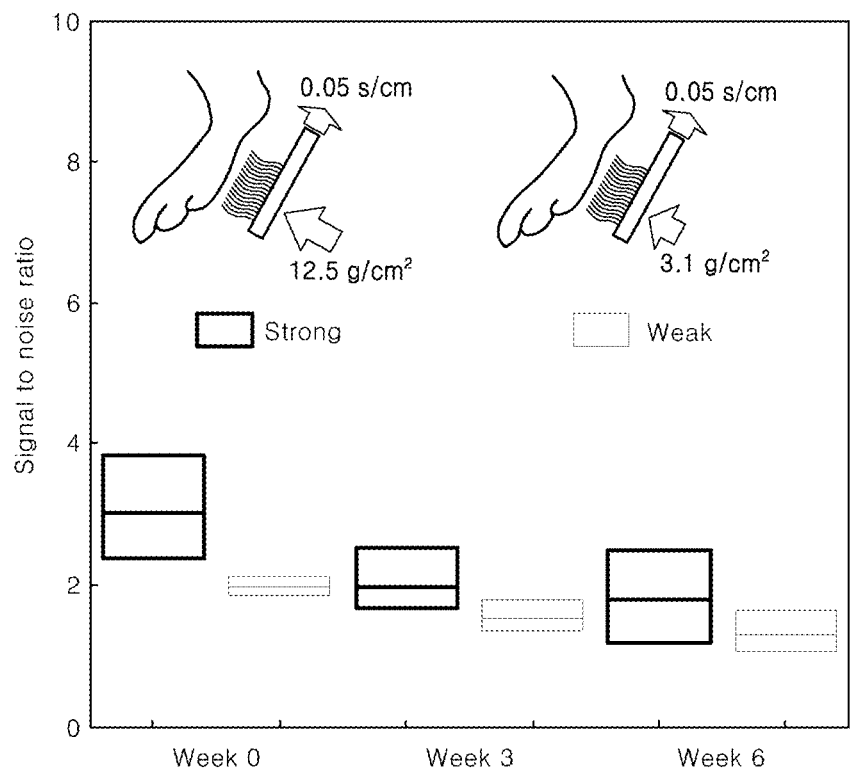
FIG. 22 shows signal to noise ratios (SNRs) of neural signals after implanting a bidirectional self-healing neural interface according to an embodiment of the present invention.
Figure 23:
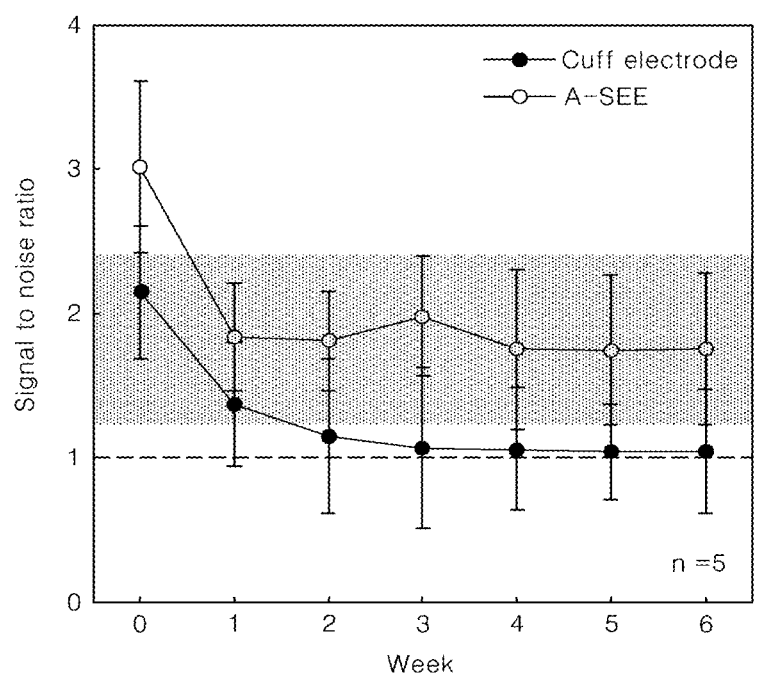
FIG. 23 shows signal to noise ratios (SNRs) of a bidirectional self-healing neural interface according to an embodiment of the present invention compared with a conventional electrode.

FIG. 22 shows signal to noise ratios (SNRs) of neural signals recorded in the A-SEE according to an embodiment of the present invention. FIG. 23 shows comparison results of SNR ratios between the bidirectional self-healing neural interface according to an embodiment of the present invention and those of a conventional cuff-type electrode using a PI substrate.

The in vivo neural signal recording was performed on right legs of five rats for 7 days. Mechanical stimulus was induced by a brush made of pig hair on hairless skin of the right hind legs of the rats with two different pressure intensities. Strong stimuli of 12.5 g/cm$^2$ (220 g—16 cm$^2$) at 0.05 s/cm and weak stimuli of 3.1 g/cm$^2$ (50 g—16 cm$^2$) at 0.05 s/cm were induced, respectively. Each stimulus was measured using a force gauge (Mark-10, USA). Each mechanical stimulus was performed for about 1 second and repeated every 5 seconds. In each test, neural signals were recorded for 60 seconds and 10 stimuli were performed. For quantification of the neural signals, SNR is defined as a ratio of an average voltage of neural signals during a time while the stimulus is induced to an average voltage of neural signals during a time while the stimulus was not induced. The average SNR for each amplifier was calculated using 5 tests and each amplifier was measured in 5 rats. For a control experiment, a conventional PI cuff-type electrode was implanted at the same position of a sciatic nerve and the same procedure was performed for neural signal recording.

Figure 39A:
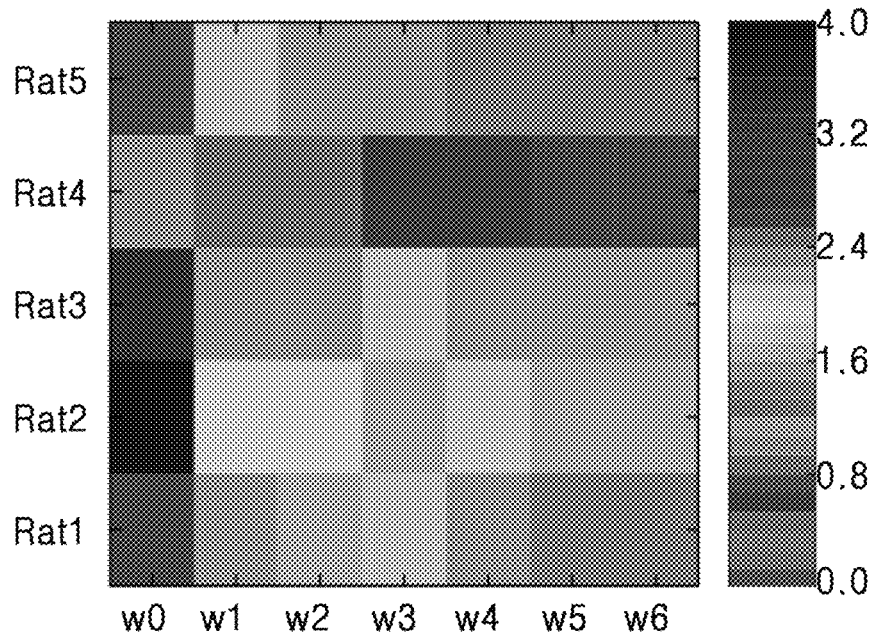
FIG. 39A shows SNR color mapping of neural signals recorded by strong mechanical stimuli after implanting a bidirectional self-healing neural interface according to an embodiment of the present invention.
Figure 39B:
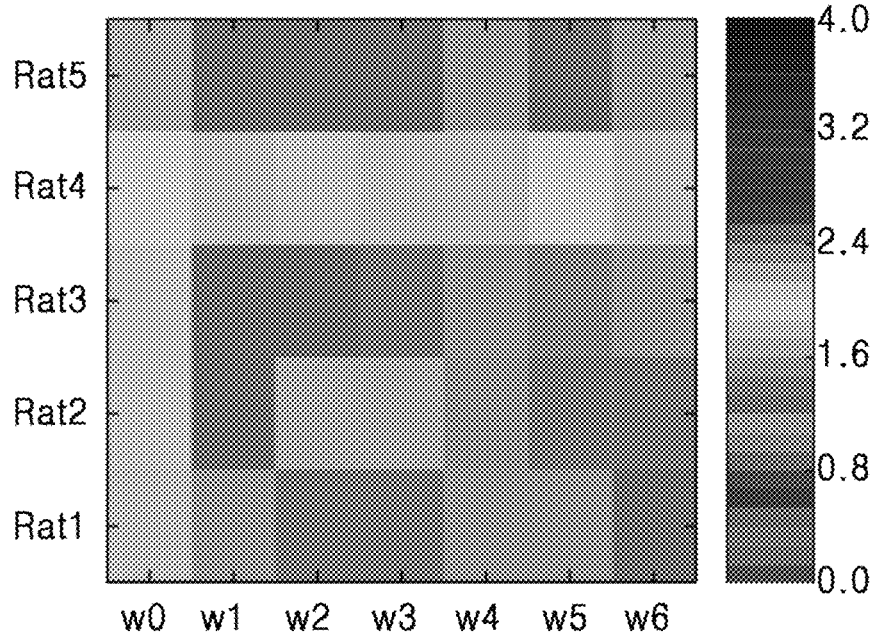
FIG. 39B shows SNR color mapping of neural signals recorded by weak mechanical stimuli after implanting a bidirectional self-healing neural interface according to an embodiment of the present invention.

The neural signals were recorded for 6 weeks (n=5) after implanting the A-SEE. FIG. 39A shows SNRs of neural signals by strong mechanical stimulus as a color mapping image. FIG. 39B shows SNRs of neural signals by weak mechanical stimulus as a color mapping image.

The average SNRs obtained using the A-SEE and the cuff electrode were 3.02 and 2.15, respectively, at week 0. After one week, the average SNRs obtained using the A-SEE and the cuff electrode were reduced to 3.02 and 2.15, respectively. As described above, this is because fibrosis of tissue caused by foreign body reactions near the implanted electronic device. However, after 6 weeks from implantation, the average SNR obtained using the A-SEE was maintained at about 1.76, but the average SNR obtained using the cuff electrode was gradually reduced to 1.04 indicating that no signal was recorded. These results indicate that high conductivity, elasticity, and even nerve tissue modulus adaptability having dynamic stress relaxing properties of the A-SEE contribute to a stable interface with the sciatic nerve enabling successful neural signal recording for a long time.

Figure 24:
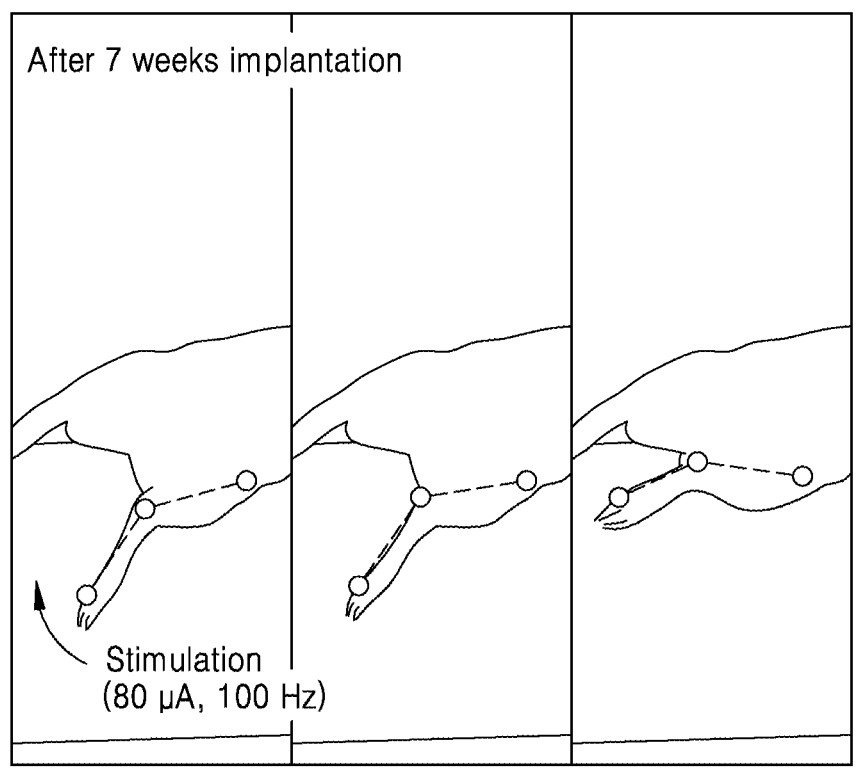
FIG. 24 shows neuroregulation performed by a bidirectional self-healing neural interface according to an embodiment of the present invention.
Figure 25:
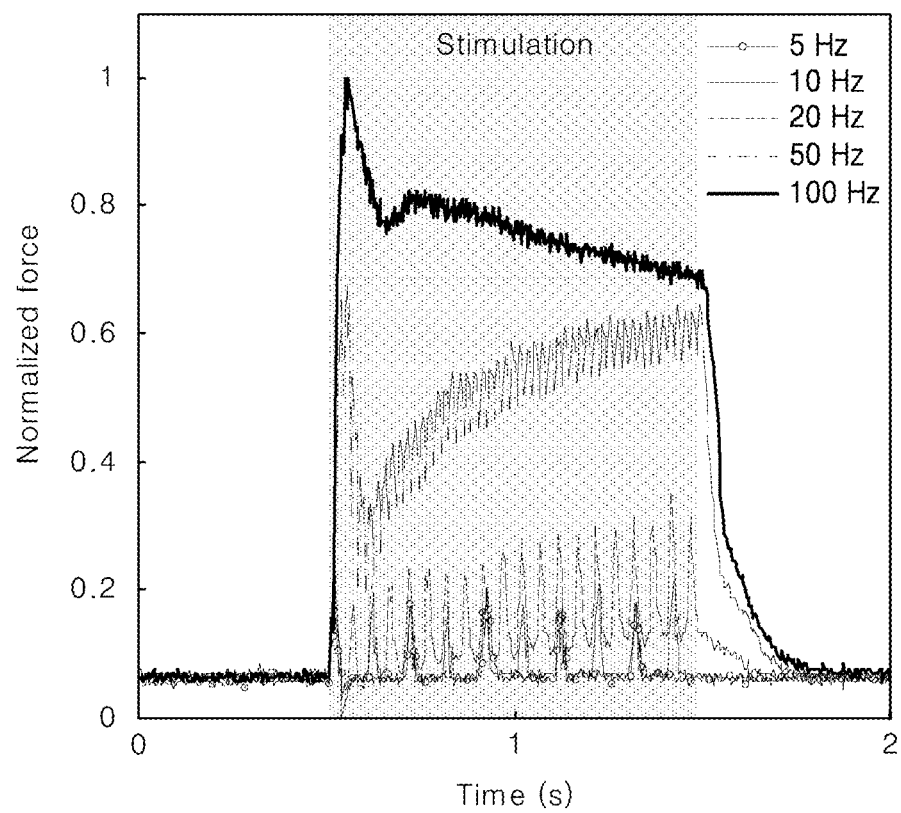
FIG. 25 is a graph illustrating force according to stimulus after implanting a bidirectional self-healing neural interface according to an embodiment of the present invention into a sciatic nerve of a rat.
Figure 26:
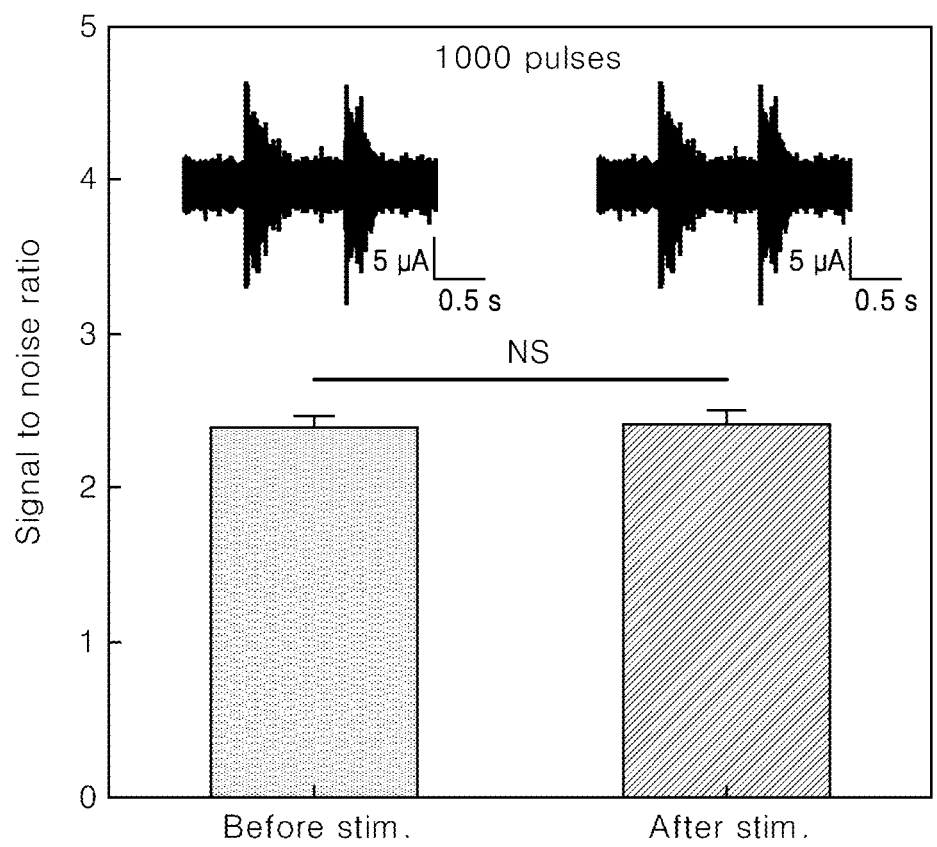
FIG. 26 shows neural signal recording performance of a bidirectional self-healing neural interface according to an embodiment of the present invention when repetitive stimuli were applied thereto.

FIG. 24 shows neuroregulation performed by the bidirectional self-healing neural interface according to an embodiment of the present invention. After 7 weeks from implantation of the A-SEE into rats, various electrical stimuli were applied to a sciatic nerve of each rat and quantitative force values induced thereby were monitored in the present study. FIG. 25 is a graph illustrating force according to stimulus after implanting the bidirectional self-healing neural interface according to an embodiment of the present invention into a sciatic nerve of a rat. FIG. 26 shows neural signal recording performance of the bidirectional self-healing neural interface according to an embodiment of the present invention when repetitive stimuli were applied thereto. Even after applying repetitive stimuli (>1000 pulses) to the A-SEE, neural signal recording performance was significantly stable due to strong adhesion between the transfer-printed AuNM and the Ag flake-SHP composite.

FIG. 29 shows stability test results of the composite according to Comparative Example 2 and the AuNM-composite according to Experimental Example. ICP-MS analysis reasonably supported the results. After culturing the A-SEEs according to the above-described example and Comparative Example 2 in a culture medium (DMEM, Dulbecco's Modified Eagle's Medium) for 7 days, the degrees of released Ag ions were measured by ICP-MS. Since a concentration of Ag ions released from the AuNM-composite was significantly low, it may be confirmed that the AuNM efficiently prevents the release of Ag ions from the composite. Thus, it may be confirmed that biocompatibility of the A-SEE may be improved as the AuNM reduces cytotoxicity induced by Ag ions.

Experimental Example 12

Figure 40:
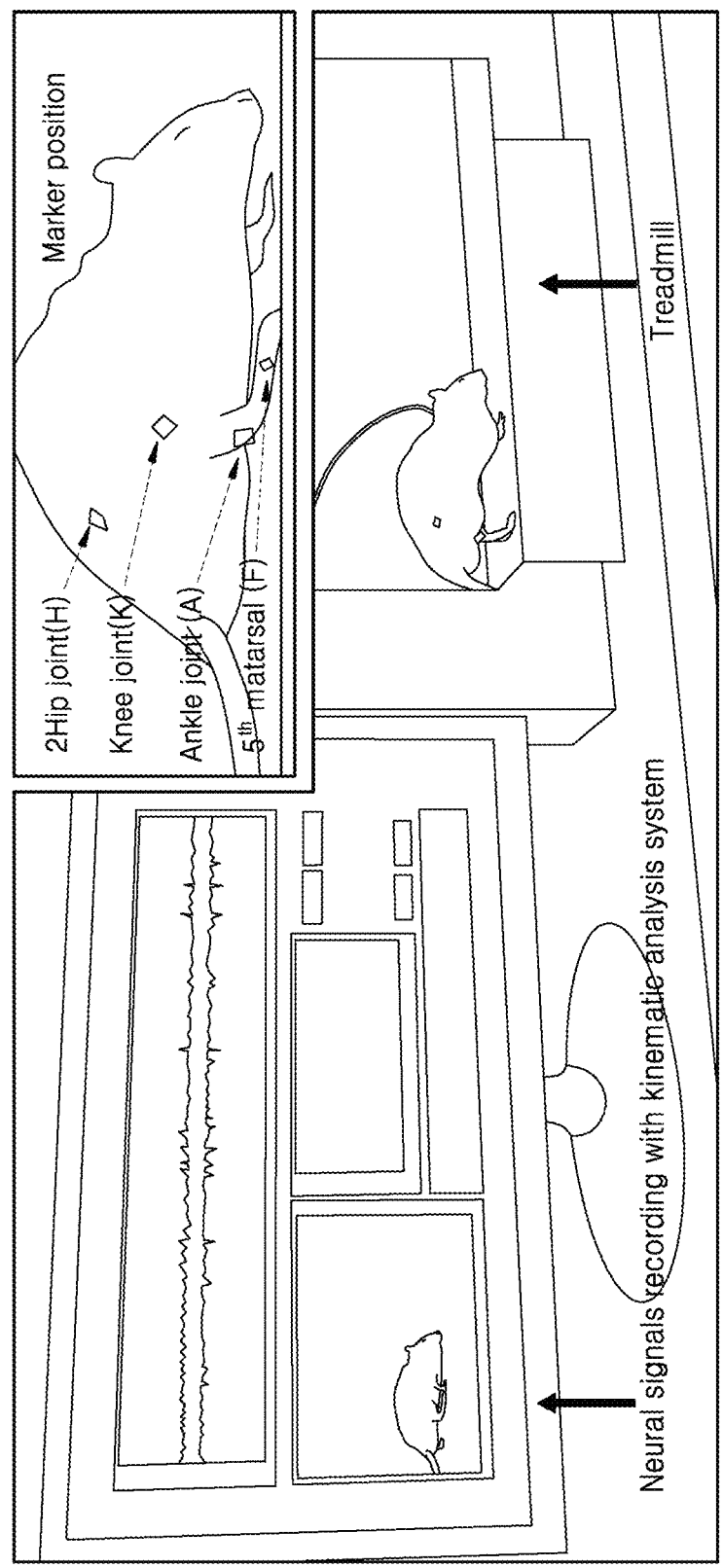
FIG. 40 shows simultaneous neural signal recording and joint kinematic analysis measured by implanting a bidirectional self-healing neural interface according to an embodiment of the present invention.

For neural signal recording of moving animals, a preamplifier was subcutaneously implanted into a hind leg of a rat with a transdermal connector. FIG. 40 shows simultaneous neural signal recording and joint kinematic analysis of an awake rat walking on a treadmill. A synchronized neural signal measurement and joint kinematic analysis system includes a neural signal recoding amplifier, a high-speed digital camera, an image acquisition board, and operating system software. The digital camera was positioned perpendicular to the trace of walking, and images were captured at 60 samples per second. Anatomical boundaries were defined as hip (H), knee (K), ankle (A), and 5$^{th}$ metatarsal (F) located at the side of the hind leg. A reflective marker was located on the anatomical boundaries.

Figure 27:
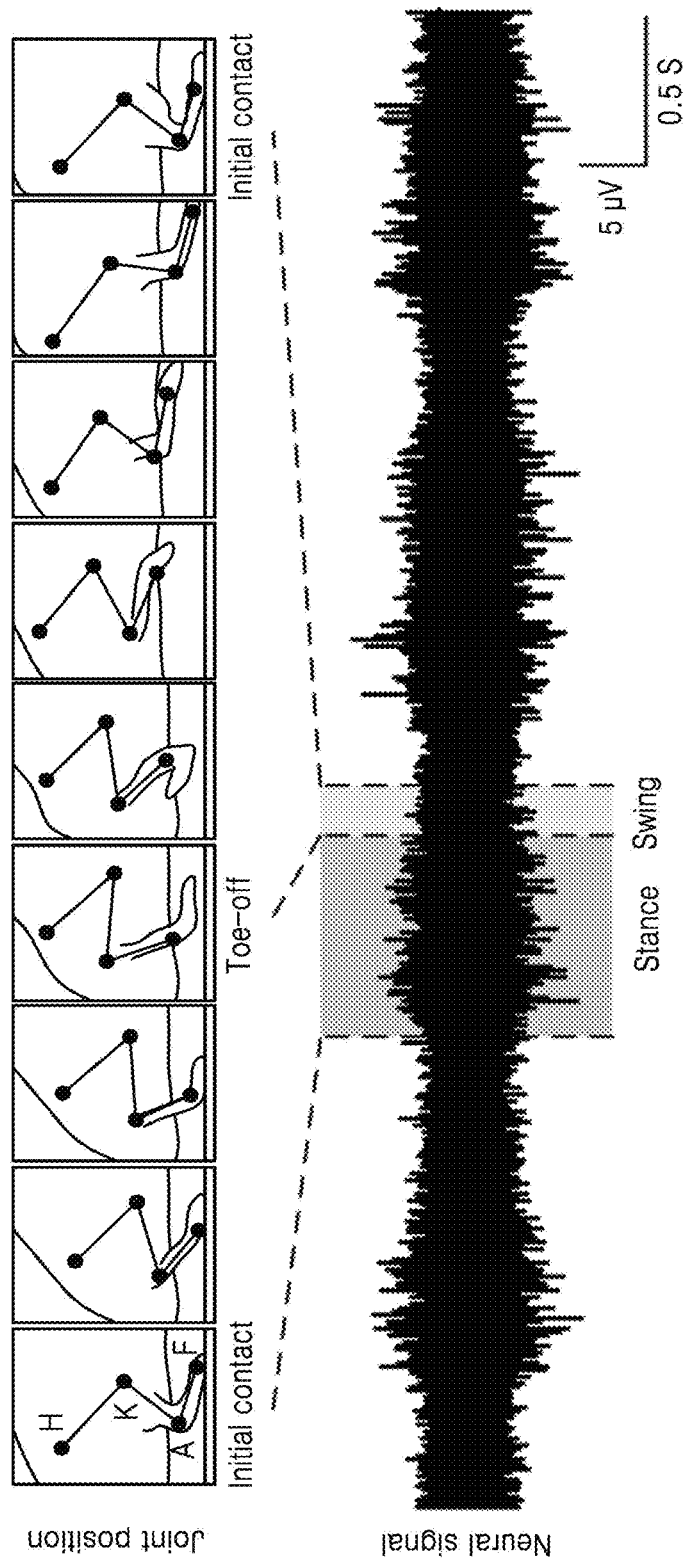
FIG. 27 shows analysis results, over time, of joint positions of a rat to which a bidirectional self-healing neural interface according to an embodiment of the present invention is applied according to changes in knee/ankle angles.
Figure 28:
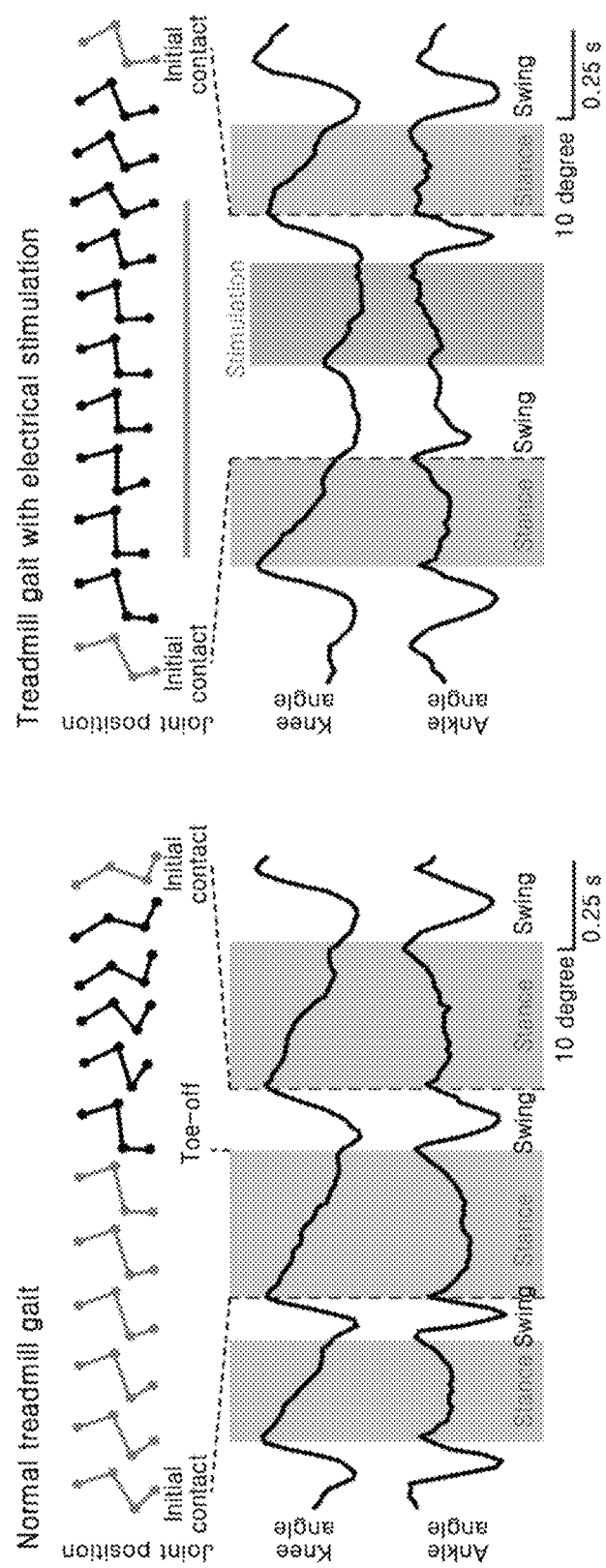
FIG. 28 shows that the gait ability of a rat, to which a bidirectional self-healing neural interface according to an embodiment of the present invention is applied, is controlled in response to a predetermined stimulus.

FIG. 27 shows an example of chronic neural signals and joint movement of an awake rat walking on a treadmill. A gait cycle was divided into two parts: stance and swing. The stance was defined as a gait cycle from an initial contact to a toe-off, and the swing was defined as a gait cycle from the toe-off to a next initial contact. Referring to FIG. 28, gaits may be regulated and controlled by applying a predetermined neuroregulation via real-time joint posture analysis in accordance with changes in knee/ankle angles. After implanting two A-SEEs into left and right sciatic nerves of an anesthetized rat, a recorded feedback signal was transmitted from one end of the sciatic nerve to the other end by bypassing the spinal nerve. The bidirectional neural interface according to an embodiment of the present invention may be applied to peripheral nerve-neural interface capable of interacting with each other.

According to an embodiment of the present invention as described above, a bidirectional self-healing neural interface having excellent elasticity and electrical conductivity improved by deformation compared to conventional interfaces. However, the scope of the present invention is not limited by such effects.

While one or more embodiments of the present invention have been described with reference to the drawings, it will be understood by those of ordinary skill in the art that various changes in form and details may be made therein without departing from the spirit and scope of the present invention as defined by the following claims.

What is claimed is:

1. A bidirectional self-healing neural interface, comprising:
    a first elastic substrate;
    a neural electrode disposed on the first elastic substrate and comprising a conductive polymer composite; and
    a second elastic substrate disposed on the neural electrode,
    wherein the conductive polymer composite comprises:
       a matrix formed of a self-healing polymer material; and
       a plurality of electrical conductor clusters distributed in the matrix,
    wherein each of the electrical conductor clusters comprises:
       particles of a first electrical conductor; and
       a plurality of particles of a second electrical conductor formed of the same material as that of the first electrical conductor, distributed around each of the particles of the first electrical conductor, and having sizes that are smaller than those of the particles of the first electrical conductor, and
    wherein the first electrical conductor is a source for generating the second electrical conductor.

2. The bidirectional self-healing neural interface of claim 1, wherein the first elastic substrate and the second elastic substrate comprise a self-healing polymer material.

3. The bidirectional self-healing neural interface of claim 1, wherein the first elastic substrate, the second elastic substrate and the neural electrode are connected by self-bonding and disposed near a nerve.

4. The bidirectional self-healing neural interface of claim 1, wherein the conductive polymer composite is a thin-film, and a gold (Au) nanomembrane is transfer-printed on one surface of the thin-film.

5. The bidirectional self-healing neural interface of claim 1, wherein the neural electrode has an electrical conductivity that increases when a deformed state induced by an external force is maintained for a predetermined period of time.

6. The bidirectional self-healing neural interface of claim 1, wherein, when the electrical conductor clusters are spaced apart from each other by a deformation thereof caused by an external force, the neural electrode undergoes a rearrangement process to connect the electrical conductor clusters.

7. The bidirectional self-healing neural interface of claim 1, wherein, when the electrical conductor clusters are spaced apart from each other by a deformation thereof caused by an external force that is maintained for a predetermined period of time, the neural electrode is rearranged such that the electrical conductor clusters are connected to each other.

8. The bidirectional self-healing neural interface of claim 1, wherein stress is relaxed when deformation caused by an external force is maintained for a predetermined period of time.

9. The bidirectional self-healing neural interface of claim 1, wherein the self-healing polymer material comprises an elastomer material including polydimethylsiloxane (PDMS), polyethyleneoxide (PEO), perfluoropolyether (PFPE), polybutylene (PB), poly(ethylene-co-1-butylene), poly(butadiene), hydrogenated poly(butadiene), a poly(ethylene oxide)-poly(propylene oxide) block copolymer or random copolymer, or poly(hydroxyalkanoate), as a backbone.

10. The bidirectional self-healing neural interface of claim 9, wherein the self-healing polymer material comprises PDMS-4,4'-methylenebis(phenyl urea) (MPU) 0.4-isophorone bisurea units (IU) 0.6.

11. The bidirectional self-healing neural interface of claim 1, wherein the first electrical conductor is a metal material.

12. The bidirectional self-healing neural interface of claim 1, wherein the metal material comprises Ag, Au, Cu, Al, W, Mo, Ti, Cr, Ni, Pt, and combinations thereof.

13. The bidirectional self-healing neural interface of claim 1, wherein the neural electrode has a strain of 3500% or less.

14. The bidirectional self-healing neural interface of claim 1, wherein the first electrical conductor has a shape that is a plate-like shape, a spherical shape, a polyhedral shape, a fibrous shape, an irregular shape, and combinations thereof.

15. The bidirectional self-healing neural interface of claim 1, wherein the first electrical conductor has a size of 500 nm to 2 μm.

16. The bidirectional self-healing neural interface of claim 1, wherein the second electrical conductor has a size of 50 nm or less.

17. A bidirectional self-healing neural interface, comprising:
    a first elastic substrate;
    a metal pad disposed on the first elastic substrate and having a plurality of holes defined therein;
    a neural electrode that comprises a conductive polymer composite, that is disposed on the first elastic substrate, and that is bonded to the first elastic substrate via the plurality of holes in the metal pad; and
    a second elastic substrate disposed on the neural electrode,
    wherein the conductive polymer composite comprises:
       a matrix formed of a self-healing polymer material; and
       a plurality of electrical conductor clusters distributed in the matrix,
    wherein each of the electrical conductor clusters comprises:
       particles of a first electrical conductor; and
       a plurality of particles of a second electrical conductor formed of the same material as that of the first electrical conductor, distributed around each of the particles of the first electrical conductor, and having sizes that are smaller than those of the particles of the first electrical conductor.

18. The bidirectional self-healing neural interface of claim 17, wherein the metal pad is configured to be additionally connected to an external neural signal recoding amplifier.

19. A bidirectional self-healing neural interface, comprising:
    a first elastic substrate;
    a substrate support layer disposed on one surface of the first elastic substrate and having a plurality of separated regions arranged at predetermined intervals;

a neural electrode disposed on the support substrate and comprising a conductive polymer composite; and a second elastic substrate disposed on the neural electrode, wherein the conductive polymer composite comprises:
a matrix formed of a self-healing polymer material; and
a plurality of electrical conductor clusters distributed in the matrix, wherein each of the electrical conductor clusters comprises:
particles of a first electrical conductor; and
a plurality of particles of a second electrical conductor formed of the same material as that of the first electrical conductor, distributed around each of the particles of the first electrical conductor, and having sizes that are smaller than those of the particles of the first electrical conductor.

\* \* \* \* \*